United States Patent
Yamamoto et al.

(10) Patent No.: US 11,929,723 B2
(45) Date of Patent: Mar. 12, 2024

(54) PHASE-VARIABLE FREQUENCY MULTIPLIER AND ANTENNA DEVICE

(71) Applicant: Mitsubishi Electric Corporation, Tokyo (JP)

(72) Inventors: Wataru Yamamoto, Tokyo (JP); Koji Tsutsumi, Tokyo (JP); Sho Ikeda, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 428 days.

(21) Appl. No.: 17/405,109

(22) Filed: Aug. 18, 2021

(65) Prior Publication Data

US 2021/0376817 A1 Dec. 2, 2021

Related U.S. Application Data

(63) Continuation of application No. PCT/JP2019/009690, filed on Mar. 11, 2019.

(51) Int. Cl.
*H03H 11/20* (2006.01)
*H01Q 3/36* (2006.01)

(52) U.S. Cl.
CPC .............. *H03H 11/20* (2013.01); *H01Q 3/36* (2013.01)

(58) Field of Classification Search
CPC ........... H01Q 3/36; H03B 19/00; H03H 11/20
See application file for complete search history.

(56) References Cited

U.S. PATENT DOCUMENTS

| | | | |
|---|---|---|---|
| 6,100,731 A | 8/2000 | Otaka | |
| 2004/0176058 A1* | 9/2004 | Johnson | H03D 7/1483 455/147 |
| 2009/0131006 A1* | 5/2009 | Wu | H03D 7/1458 455/257 |

FOREIGN PATENT DOCUMENTS

| | | |
|---|---|---|
| JP | 61-129908 A | 6/1986 |
| JP | 11-97934 A | 4/1999 |

* cited by examiner

*Primary Examiner* — Timothy X Pham
(74) *Attorney, Agent, or Firm* — Birch, Stewart, Kolasch & Birch, LLP

(57) ABSTRACT

A phase-variable frequency multiplier includes: a 90-degree divider for dividing an input signal into an I-signal and a Q-signal; an amplitude setting circuit for distributing each of the I-signal and the Q-signal to two paths, setting amplitudes of two of four signals including the two distributed I-signals and the two distributed Q-signals depending on a phase shift amount of the input signal, and outputting as set signals, the four signals including the signals with the set amplitudes; a first mixer for multiplying one of the two I-signals included in the set signals by one of the two Q-signals included in the set signals to generate a first signal having a frequency being twice the frequency of the input signal; a second mixer for multiplying the other of the two I-signals included in the set signals by the other of the two Q-signals included in the set signals to generate a second signal with an amplitude ratio with respect to the first signal, being a tangent or a reciprocal of a tangent of the phase shift amount and with a frequency being twice the frequency of the input signal; and a 90-degree combiner for applying a phase difference of 90 degrees between the first signal and the second signal, and combining the first signal having the phase difference of 90 degrees from the second signal with the second signal.

13 Claims, 13 Drawing Sheets

PHASE-VARIABLE FREQUENCY MULTIPLIER AND ANTENNA DEVICE

CROSS REFERENCE TO RELATED APPLICATIONS

This application is a Continuation of PCT International Application No. PCT/JP2019/009690, filed on Mar. 11, 2019, which is hereby expressly incorporated by reference into the present application.

TECHNICAL FIELD

The present invention relates to a phase-variable frequency multiplier and an antenna device that apply a phase difference of 90 degrees between a first signal with a frequency that is twice the frequency of an input signal and a second signal with a frequency that is twice the frequency of the input signal, and combine the first signal with a phase difference of 90 degrees from the second signal with the second signal.

BACKGROUND ART

Patent Literature 1 mentioned below teaches a frequency multiplier including a multiplier that multiplies a local signal with an angular frequency of $\omega_c/2$ by a local signal with an angular frequency of $\omega_c/2$ and a phase difference $\phi$. $\phi$ represents the phase difference between the two local signals, and the two local signals have a frequency of $f_c/2$.

In the frequency multiplier taught in Patent Literature 1, the multiplier multiplies the two local signals to generate a signal with a frequency of $f_c$.

CITATION LIST

Patent Literature

Patent Literature 1: JP H11-97934 A

SUMMARY OF INVENTION

Technical Problem

Connection of a phase shifter in a low-frequency band before the multiplier included in the frequency multiplier taught in Patent Literature 1 can achieve a phase-variable frequency multiplier capable of doubling the frequency of a signal in a low-frequency band generated by a signal source and changing the phase of the signal, for example.

In this phase-variable frequency multiplier, when a signal with a phase of 0 degrees is input, for example, the phase of a signal output from the phase shifter having a phase shift amount θ is θ, and the multiplier doubles the frequency of the signal output from the phase shifter. In this case, the multiplier also doubles the phase of the signal output from the phase shifter, and a signal output from the multiplier therefore has a phase of 2θ.

Thus, this phase-variable frequency multiplier has a problem in that the phase shift of the signal output from the multiplier is greater than the phase shift of the signal output from the phase shifter, and thus the multiplier lowers the phase shift resolution.

The present invention has been made to solve such problems as described above, and an object thereof is to provide a phase-variable frequency multiplier and an antenna device capable of doubling the frequency of an input signal and shifting the phase of the input signal without degrading the phase shift resolution.

Solution to Problem

A phase-variable frequency multiplier according to the present invention includes: a 90-degree divider to divide an input signal into an in-phase signal and a quadrature signal; an amplitude setting circuit to distribute each of the in-phase signal and the quadrature signal to two paths, set amplitudes of one or more of four signals including the two distributed in-phase signals and the two distributed quadrature signals depending on a phase shift amount of the input signal, and outputting, as set signals, the four signals including one or more signals with the set amplitudes; a first mixer to multiply a first in-phase signal of the two in-phase signals included in the set signals by a first quadrature signal of the two quadrature signals included in the set signals to generate a first signal with a doubled frequency being twice a frequency of the input signal; a second mixer to multiply a second in-phase signal of the two in-phase signals included in the set signals by a second quadrature signal of the two quadrature signals included in the set signals to generate a second signal with an amplitude ratio with respect to the first signal, being a tangent of, or a reciprocal of a tangent of, the phase shift amount and with the doubled frequency; and a 90-degree combiner to apply a phase difference of 90 degrees between the first signal and the second signal, and combine the first signal having the phase difference of 90 degrees from the second signal with the second signal.

Advantageous Effects of Invention

The present invention enables the frequency of an input signal to be doubled and the phase of the input signal to be shifted without degrading the phase shift resolution.

DESCRIPTION OF EMBODIMENTS

Embodiments for carrying out the invention will now be described with reference to the accompanying drawings for more detailed explanation of the invention.

First Embodiment

Figure 1:
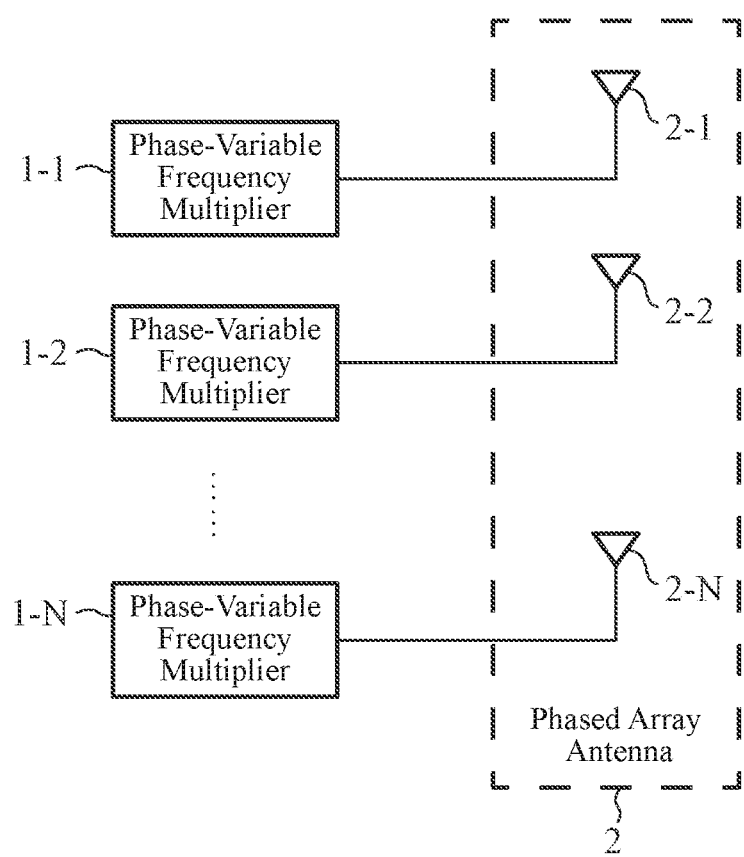
FIG. 1 is a configuration diagram illustrating an antenna device including phase-variable frequency multipliers according to a first embodiment.

FIG. 1 is a configuration diagram illustrating an antenna device including phase-variable frequency multipliers according to a first embodiment.

Figure 2:
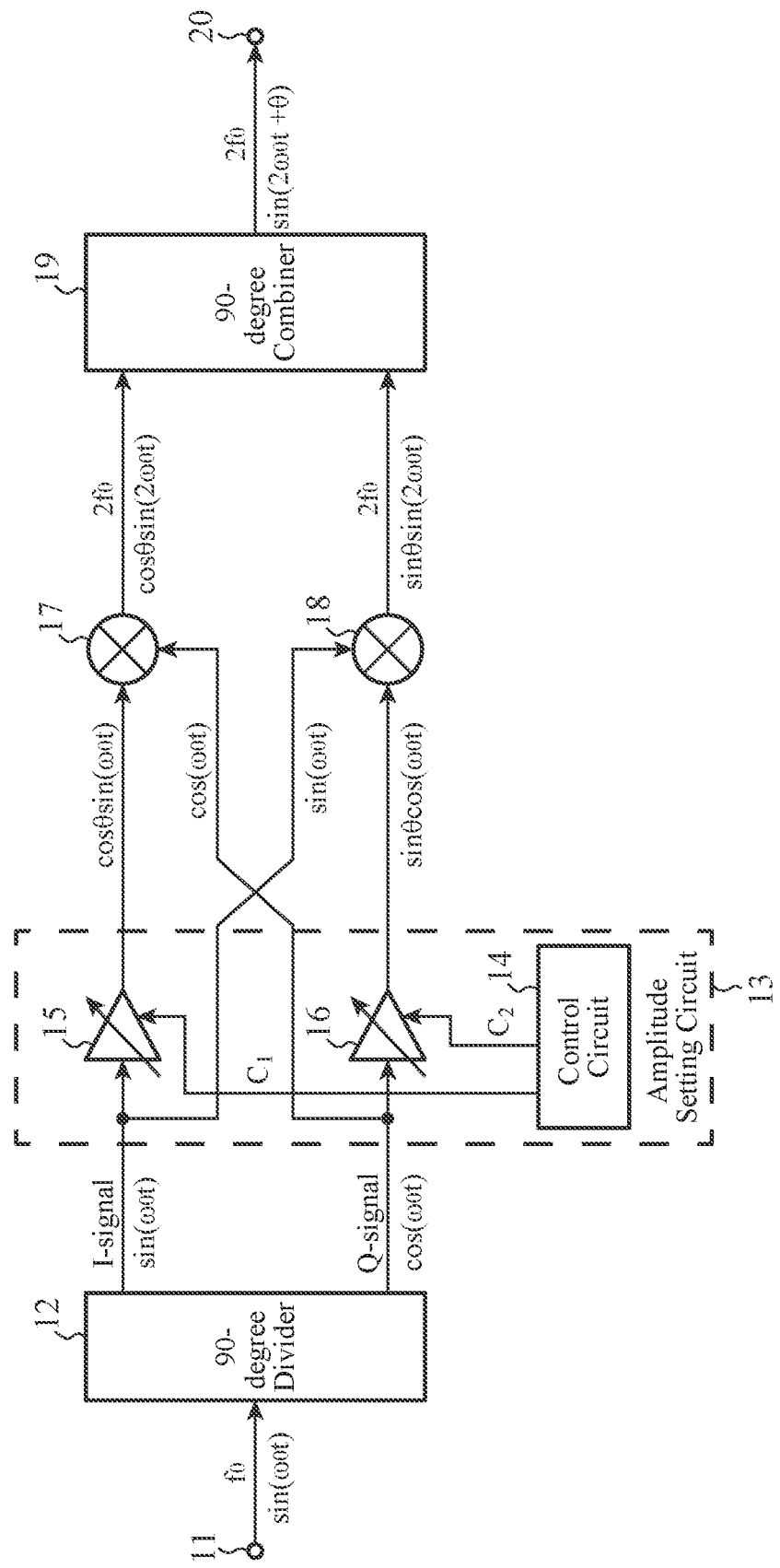
FIG. 2 is a configuration diagram illustrating a phase-variable frequency multiplier according to the first embodiment.

FIG. 2 is a configuration diagram illustrating a phase-variable frequency multiplier according to the first embodiment.

In FIGS. 1 and 2, phase-variable frequency multipliers 1-1 to 1-N each shift the phase of an input signal, and output the phase-shifted input signal to a phased array antenna 2. N is an integer equal to or larger than 2.

Hereinafter, N phase-variable frequency multipliers 1-1 to 1-N will be referred to as phase-variable frequency multipliers 1 when the phase-variable frequency multipliers 1-1 to 1-N are not distinguished from each other.

The phased array antenna 2 includes N antenna elements 2-1 to 2-N.

An antenna element 2-$n$ ($n=1, \ldots, N$) is connected with a phase-variable frequency multiplier 1-$n$.

The antenna element 2-$n$ transmits an input signal resulting from phase-shifting by the phase-variable frequency multiplier 1-$n$.

An input terminal 11 is a terminal for inputting a sinusoidal input signal $\sin(\omega_0 t)$ with frequency $f_0$ from outside of the device. Symbol $\omega_0$ represents angular frequency, and t represents time.

In the phase-variable frequency multiplier illustrated in FIG. 2, a sinusoidal input signal $\sin(\omega_0 t)$ is input via the input terminal 11. This is, however, merely an example, and a cosine input signal $\cos(\omega_0 t)$ with frequency $f_0$, for example, may be input via the input terminal 11.

A 90-degree divider 12 divides the input signal input via the input terminal 11 into an in-phase signal (hereinafter referred to as an "I-signal") and a quadrature signal (hereinafter referred to as a "Q-signal"), and outputs each of the I-signal and the Q-signal to an amplitude setting circuit 13.

The I-signal is represented by $\sin(\omega_0 t)$, and the Q-signal is represented by $\cos(\omega_0 t)$.

The amplitude setting circuit 13 includes a control circuit 14, a first variable gain amplifier 15, and a second variable gain amplifier 16.

The amplitude setting circuit 13 distributes each of the I-signal and the Q-signal output from the 90-degree divider 12 to two paths.

One of the two I-signals distributed to two paths by the amplitude setting circuit 13 is input to the first variable gain amplifier 15, and the other I-signal is input to a second mixer 18, which will be described later.

One of the two Q-signals distributed to two paths by the amplitude setting circuit 13 is input to a first mixer 17, which will be described later, and the other Q-signal is input to the second variable gain amplifier 16.

The amplitude setting circuit 13 sets the amplitudes of two of the four signals, which are the two distributed I-signals and the two distributed Q-signals, depending on a phase shift amount $\theta$ of the input signal $\sin(\omega_0 t)$.

In the phase-variable frequency multiplier illustrated in FIG. 2, the amplitude setting circuit 13 sets the amplitude of one I-signal depending on the phase shift amount $\theta$ of the input signal $\sin(\omega_0 t)$, and sets the amplitude of the other Q-signal depending on the phase shift amount $\theta$ of the input signal $\sin(\omega_0 t)$.

In the phase-variable frequency multiplier illustrated in FIG. 2, all of the four signals output from the amplitude setting circuit 13, that is, not only the signals whose amplitudes are set by the amplitude setting circuit 13, will be referred to as set signals.

An internal memory of the control circuit 14 stores the phase shift amount $\theta$ of the input signal $\sin(\omega_0 t)$.

In the phase-variable frequency multiplier 1 illustrated in FIG. 2, the phase shift amount $\theta$ of the input signal $\sin(\omega_0 t)$ is stored in the internal memory of the control circuit 14. This is, however, merely an example, and the phase shift amount $\theta$ of the input signal $\sin(\omega_0 t)$ may be given from outside of the control circuit to the control circuit 14.

The control circuit 14 outputs, to the first variable gain amplifier 15, a control signal $C_1$ for controlling the first variable gain amplifier 15 so that the amplitude of the I-signal is a cosine $\cos\theta$ of the phase shift amount $\theta$.

The control circuit 14 outputs, to the second variable gain amplifier 16, a control signal $C_2$ for controlling the second variable gain amplifier 16 so that the amplitude of the Q-signal is a sine $\sin\theta$ of the phase shift amount $\theta$.

The first variable gain amplifier 15 sets the amplitude of one of the two I-signals in accordance with the control signal $C_1$ output from the control circuit 14 so that the amplitude of the one I-signal is a cosine $\cos\theta$ of the phase shift amount $\theta$.

The one I-signal with the amplitude set by the first variable gain amplifier 15 is represented by $\cos\theta \sin(\omega_0 t)$.

The first variable gain amplifier 15 outputs the one I-signal with the set amplitude to the first mixer 17.

The second variable gain amplifier 16 sets the amplitude of the other of the two Q-signals in accordance with the control signal $C_2$ output from the control circuit 14 so that the amplitude of the other Q-signal is a sine $\sin\theta$ of the phase shift amount $\theta$.

The other Q-signal with the amplitude set by the second variable gain amplifier 16 is represented by $\sin\theta \cos(\omega_0 t)$.

The second variable gain amplifier 16 outputs the other Q-signal with the set amplitude to the second mixer 18.

The first mixer 17 multiplies the one I-signal with the amplitude set by the first variable gain amplifier 15 by the one Q-signal output from the amplitude setting circuit 13 to generate a first signal having a frequency $2f_0$, which is twice the frequency $f_0$ of the input signal $\sin(\omega_0 t)$.

The first signal generated by the first mixer 17 is represented by $\cos\theta \sin(2\omega_0 t)$.

The first mixer 17 outputs the generated first signal to a 90-degree combiner 19.

The second mixer 18 multiplies the other I-signal output from the amplitude setting circuit 13 by the other Q-signal with the amplitude set by the second variable gain amplifier 16 to generate a second signal having a frequency $2f_0$, which is twice the frequency $f_0$ of the input signal $\sin(\omega_0 t)$.

The second signal generated by the second mixer 18 is represented by $\sin\theta\,\sin(2\omega_0 t)$, and a ratio $\cos\theta/\sin\theta$ of the amplitude $\cos\theta$ of the first signal to the amplitude $\sin\theta$ of the second signal is a reciprocal $1/\tan\theta$ of a tangent of the phase shift amount $\theta$.

The second mixer 18 outputs the generated second signal to the 90-degree combiner 19.

The 90-degree combiner 19 applies a phase difference of 90 degrees between the first signal generated by the first mixer 17 and the second signal generated by the second mixer 18, and combines the first signal having a phase difference of 90 degrees from the second signal with the second signal.

The 90-degree combiner 19 outputs a combined signal of the first signal and the second signal to an output terminal 20.

The combined signal of the first signal and the second signal is represented by $\sin(2\omega_0 t + \theta)$, and the frequency of the combined signal is $2f_0$.

The phase difference between the combined signal $\sin(2\omega_0 t + \theta)$ and the input signal $\sin(\omega_0 t)$ is $\theta$.

The output terminal 20 of the phase-variable frequency multiplier 1-$n$ ($n=1, \ldots, N$) is a terminal for outputting the combined signal $\sin(2\omega_0 t + \theta)$ to the antenna element 2-$n$ of the phased array antenna 2.

Next, the operation of the phase-variable frequency multiplier 1 illustrated in FIG. 2 will be explained.

The 90-degree divider 12 divides the input signal $\sin(\omega_0 t)$ with the frequency $f_0$ input via the input terminal 11 into the I-signal $\sin(\omega_0 t)$ and the Q-signal $\cos(\omega_0 t)$.

The 90-degree divider 12 outputs each of the I-signal $\sin(\omega_0 t)$ and the Q-signal $\cos(\omega_0 t)$ to the amplitude setting circuit 13.

Upon receiving the I-signal $\sin(\omega_0 t)$ from the 90-degree divider 12, the amplitude setting circuit 13 distributes the I-signal $\sin(\omega_0 t)$ to two paths.

The amplitude setting circuit 13 outputs one of the two distributed I-signals $\sin(\omega_0 t)$ to the first variable gain amplifier 15, and the other I-signal $\sin(\omega_0 t)$ to the second mixer 18.

Upon receiving the Q-signal $\cos(\omega_0 t)$ from the 90-degree divider 12, the amplitude setting circuit 13 distributes the Q-signal $\cos(\omega_0 t)$ to two paths.

The amplitude setting circuit 13 outputs one of the two distributed Q-signals $\cos(\omega_0 t)$ to the first mixer 17, and the other Q-signal $\cos(\omega_0 t)$ to the second variable gain amplifier 16.

The control circuit 14 outputs, to the first variable gain amplifier 15, the control signal $C_1$ for controlling the first variable gain amplifier 15 so that the amplitude of the I-signal $\sin(\omega_0 t)$ is a cosine $\cos\theta$ of the phase shift amount $\theta$.

Upon receiving the control signal $C_1$ from the control circuit 14, the first variable gain amplifier 15 sets the amplitude of the one I-signal $\sin(\omega_0 t)$ in accordance with the control signal $C_1$ so that the amplitude of the one I-signal $\sin(\omega_0 t)$ is a cosine $\cos\theta$ of the phase shift amount $\theta$.

The first variable gain amplifier 15 outputs the one I-signal $\cos\theta\,\sin(\omega_0 t)$ with the set amplitude to the first mixer 17.

The control circuit 14 outputs, to the second variable gain amplifier 16, the control signal $C_2$ for controlling the second variable gain amplifier 16 so that the amplitude of the Q-signal $\cos(\omega_0 t)$ is a sine $\sin\theta$ of the phase shift amount $\theta$.

Upon receiving the control signal $C_2$ from the control circuit 14, the second variable gain amplifier 16 sets the amplitude of the other Q-signal $\cos(\omega_0 t)$ in accordance with the control signal $C_2$ so that the amplitude of the other Q-signal $\cos(\omega_0 t)$ is a sine $\sin\theta$ of the phase shift amount $\theta$.

The second variable gain amplifier 16 outputs the other Q-signal $\sin\theta\,\cos(\omega_0 t)$ with the set amplitude to the second mixer 18.

Upon receiving the I-signal $\cos\theta\,\sin(\omega_0 t)$ from the first variable gain amplifier 15 and the Q-signal $\cos(\omega_0 t)$ from the amplitude setting circuit 13, the first mixer 17 multiplies the I-signal $\cos\theta\,\sin(\omega_0 t)$ by the Q-signal $\cos(\omega_0 t)$.

As a result of multiplication of the I-signal $\cos\theta\,\sin(\omega_0 t)$ by the Q-signal $\cos(\omega_0 t)$ by the first mixer 17, the first signal $\cos\theta\,\sin(2\omega_0 t)$ with the frequency $2f_0$, which is twice the frequency $f_0$ of the input signal $\sin(\omega_0 t)$, is generated.

The first mixer 17 outputs the generated first signal $\cos\theta\,\sin(2\omega_0 t)$ to the 90-degree combiner 19.

Upon receiving the I-signal $\sin(\omega_0 t)$ from the amplitude setting circuit 13 and the Q-signal $\sin\theta\,\cos(\omega_0 t)$ from the second variable gain amplifier 16, the second mixer 18 multiplies the I-signal $\sin(\omega_0 t)$ by the Q-signal $\sin\theta\,\cos(\omega_0 t)$.

As a result of multiplication of the I-signal $\sin(\omega_0 t)$ by the Q-signal $\sin\theta\,\cos(\omega_0 t)$ by the second mixer 18, the second signal $\sin\theta\,\sin(2\omega_0 t)$ with the frequency $2f_0$, which is twice the frequency $f_0$ of the input signal $\sin(\omega_0 t)$, is generated.

The ratio $\cos\theta/\sin\theta$ of the amplitude $\cos\theta$ of the first signal $\cos\theta\,\sin(2\omega_0 t)$ generated by the first mixer 17 to the amplitude $\sin\theta$ of the second signal $\sin\theta\,\sin(2\omega_0 t)$ generated by the second mixer 18 is a reciprocal $1/\tan\theta$ of a tangent of the phase shift amount $\theta$.

Because the ratio $\cos\theta/\sin\theta$ of the amplitude $\cos\theta$ of the first signal $\cos\theta\,\sin(2\omega_0 t)$ to the amplitude $\sin\theta$ of the second signal $\sin\theta\,\sin(2\omega_0 t)$ is a reciprocal $1/\tan\theta$ of a tangent of the phase shift amount $\theta$, the 90-degree combiner 19 can perform 90-degree combination of the first signal $\cos\theta\,\sin(2\omega_0 t)$ with the second signal $\sin\theta\,\sin(2\omega_0 t)$.

The second mixer 18 outputs the generated second signal $\sin\theta\,\sin(2\omega_0 t)$ to the 90-degree combiner 19.

Figure 3:
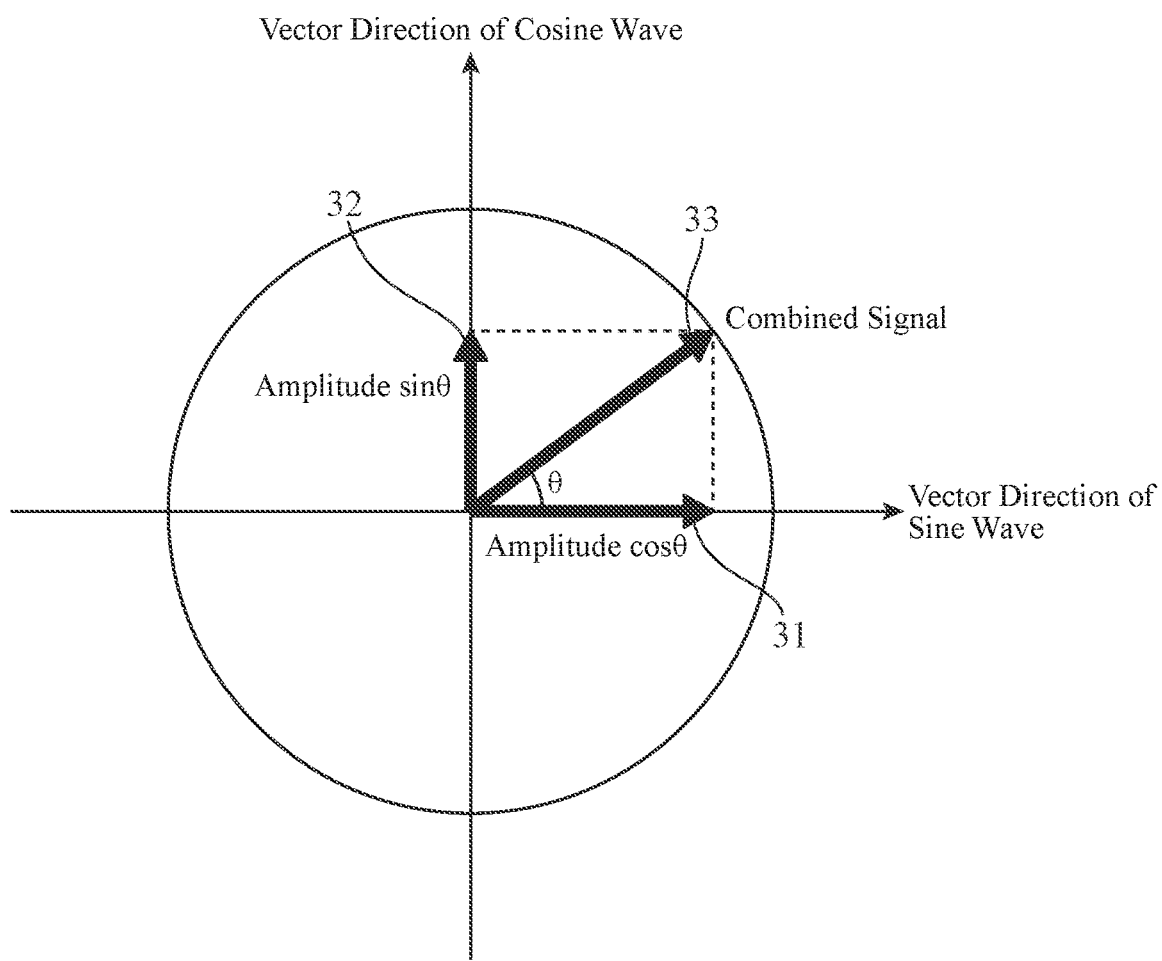
FIG. 3 is an explanatory diagram illustrating combining of a first signal with a second signal.

As illustrated in FIG. 3, the 90-degree combiner 19 applies a phase difference of 90 degrees between the first signal $\cos\theta\,\sin(2\omega_0 t)$ generated by the first mixer 17 and the second signal $\sin\theta\,\sin(2\omega_0 t)$ generated by the second mixer 18.

FIG. 3 is an explanatory diagram illustrating combining of the first signal with the second signal.

In FIG. 3, 31 represents the first signal $\cos\theta\,\sin(2\omega_0 t)$ generated by the first mixer 17, and 32 represents the second signal to which the phase difference of 90 degrees from the first signal is applied by the 90-degree combiner 19.

In FIG. 3, the 90-degree combiner 19 shifts the phase of the second signal $\sin\theta\,\sin(2\omega_0 t)$ by 90 degrees to apply the phase difference of 90 degrees between the first signal $\cos\theta\,\sin(2\omega_0 t)$ and the second signal $\sin\theta\,\sin(2\omega_0 t)$. This is, however, merely an example, and the 90-degree combiner 19 may shift the phase of the first signal $\cos\theta\,\sin(2\omega_0 t)$ by 90 degrees to apply the phase difference of 90 degrees between the first signal $\cos\theta\,\sin(2\omega_0 t)$ and the second signal $\sin\theta\,\sin(2\omega_0 t)$.

The 90-degree combiner 19 applies the phase difference of 90 degrees between the first signal $\cos\theta\,\sin(2\omega_0 t)$ and the second signal $\sin\theta\,\sin(2\omega_0 t)$, and then combines the first signal with the second signal as illustrated in FIG. 3.

The 90-degree combiner 19 outputs the combined signal $\sin(2\omega_0 t + \theta)$ of the first signal and the second signal to the output terminal 20.

In FIG. 3, 33 represents the combined signal $\sin(2\omega_0 t+\theta)$ of the first signal and the second signal.

The amplitude of the combined signal $\sin(2\omega_0 t+\theta)$ is $((\cos\theta)^2+(\sin\theta)^2)^{1/2}=1$, and the phase of the combined signal $\sin(2\omega_0 t+\theta)$ is $(2\omega_0 t+\theta)$.

The phase difference between the combined signal $\sin(2\omega_0 t+\theta)$ and the input signal $\sin(\omega_0 t)$ is equal to the phase shift amount $\theta$, and the frequency $2f_0$ of the combined signal $\sin(2\omega_0 t+\theta)$ is twice the frequency $f_0$ of the input signal $\sin(\omega_0 t)$.

In the phase-variable frequency multiplier 1 illustrated in FIG. 2, the phase difference between the combined signal $\sin(2\omega_0 t+\theta)$ and the input signal $\sin(\omega_0 t)$ is equal to the phase shift amount $\theta$, and the phase of the input signal $\sin(\omega_0 t)$ is not doubled, unlike the phase-variable frequency multiplier described in Patent Literature 1 in which a phase shifter is connected before the frequency multiplier. Thus, with the phase-variable frequency multiplier 1 illustrated in FIG. 2, the phase shift resolution is not degraded, unlike the phase-variable frequency multiplier in which a phase shifter is connected before the frequency multiplier.

In the first embodiment described above, the phase-variable frequency multiplier 1 has a configuration including the 90-degree divider 12 that divides an input signal into an I-signal and a Q-signal, and the amplitude setting circuit 13 that distributes each of the I-signal and the Q-signal to two paths, sets the amplitudes of two of the four signals, which are the two distributed I-signals and the two distributed Q-signals, depending on the phase shift amount of the input signal, and outputs, as set signals, four signals including the signal with the set amplitudes. In addition, the phase-variable frequency multiplier 1 includes the first mixer 17 that multiplies one of the two I-signals included in the set signals by one of the two Q-signals included in the set signals to generate a first signal with a frequency that is twice the frequency of the input signal. The phase-variable frequency multiplier 1 includes the second mixer 18 that multiplies the other of the two I-signals included in the set signals by the other of the two Q-signals included in the set signals to generate a second signal with an amplitude ratio being a reciprocal of a tangent of the phase shift amount with respect to the first signal and with a frequency that is twice the frequency of the input signal. The phase-variable frequency multiplier 1 also includes the 90-degree combiner 19 that applies a phase difference of 90 degrees between the first signal and the second signal, and combines the first signal having a phase difference of 90 degrees from the second signal with the second signal. The phase-variable frequency multiplier 1 is therefore capable of doubling the frequency of the input signal and shifting the phase of the input signal without degrading the phase shift resolution.

In the phase-variable frequency multiplier 1 illustrated in FIG. 2, the first variable gain amplifier 15 sets the amplitude of the one I-signal $\sin(\omega_0 t)$, and the second variable gain amplifier 16 sets the amplitude of the other Q-signal $\cos(\omega_0 t)$. This is, however, merely an example, and the first variable gain amplifier 15 may set the amplitude of the other I-signal $\sin(\omega_0 t)$, and the second variable gain amplifier 16 may set the amplitude of the one Q-signal $\cos(\omega_0 t)$, as illustrated in FIG. 4.

Figure 4:
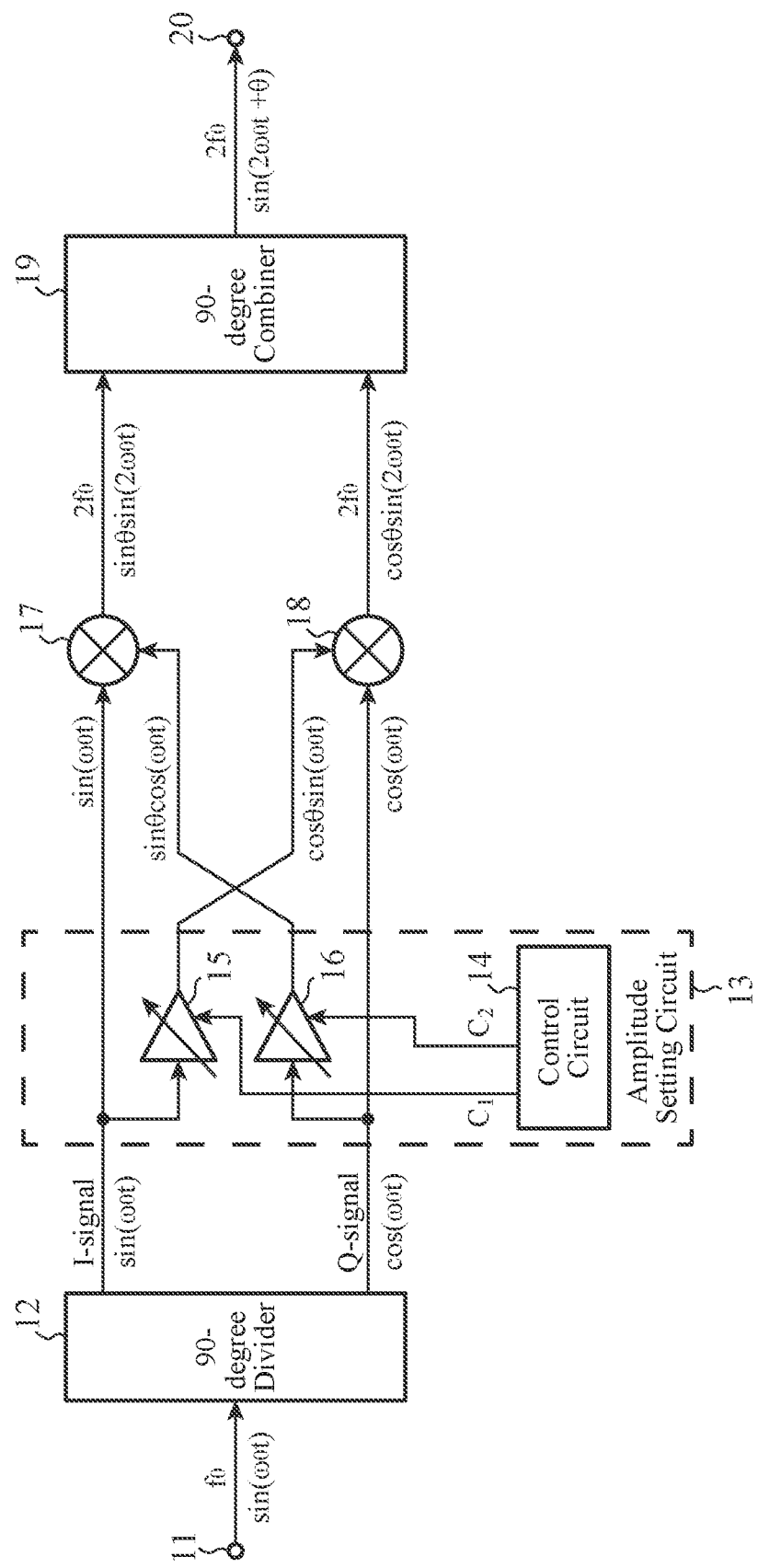
FIG. 4 is a configuration diagram illustrating another phase-variable frequency multiplier according to the first embodiment.

FIG. 4 is a configuration diagram illustrating another phase-variable frequency multiplier according to the first embodiment.

In the phase-variable frequency multiplier 1 illustrated in FIG. 4, the first variable gain amplifier 15 sets the amplitude of the other I-signal $\sin(\omega_0 t)$ so that the amplitude of the other I-signal $\sin(\omega_0 t)$ is a cosine $\cos\theta$ of the phase shift amount $\theta$. The second variable gain amplifier 16 sets the amplitude of the one Q-signal $\cos(\omega_0 t)$ so that the amplitude of the one Q-signal $\cos(\omega_0 t)$ is a sine $\sin\theta$ of the phase shift amount $\theta$.

The first mixer 17 multiplies the one I-signal $\sin(\omega_0 t)$ output from the amplitude setting circuit 13 by the one Q-signal $\sin\theta\cos(\omega_0 t)$ with the amplitude set by the second variable gain amplifier 16 to generate a first signal $\sin\theta\sin(2\omega_0 t)$.

The second mixer 18 multiplies the other I-signal $\cos\theta\sin(\omega_0 t)$ with the amplitude set by the first variable gain amplifier 15 by the other Q-signal $\cos(\omega_0 t)$ output from the amplitude setting circuit 13 to generate a second signal $\cos\theta\sin(2\omega_0 t)$.

The ratio $\sin\theta/\cos\theta$ of the amplitude $\sin\theta$ of the first signal $\sin\theta\sin(2\omega_0 t)$ generated by the first mixer 17 to the amplitude $\cos\theta$ of the second signal $\cos\theta\sin(2\omega_0 t)$ generated by the second mixer 18 is a tangent $\tan\theta$ of the phase shift amount $\theta$.

Because the ratio $\sin\theta/\cos\theta$ of the amplitude $\sin\theta$ of the first signal $\sin\theta\sin(2\omega_0 t)$ to the amplitude $\cos\theta$ of the second signal $\cos\theta\sin(2\omega_0 t)$ is the tangent $\tan\theta$ of the phase shift amount $\theta$, the 90-degree combiner 19 can perform 90-degree combination of the first signal $\sin\theta\sin(2\omega_0 t)$ with the second signal $\cos\theta\sin(2\omega_0 t)$.

Second Embodiment

In the phase-variable frequency multiplier 1 illustrated in FIG. 2, the amplitude setting circuit 13 includes the second variable gain amplifier 16 that sets the amplitude of the Q-signal $\cos(\omega_0 t)$ so that the amplitude of the Q-signal $\cos(\omega_0 t)$ is a sine $\sin\theta$ of the phase shift amount $\theta$.

In a second embodiment, a phase-variable frequency multiplier 1 in which an amplitude setting circuit 40 includes, instead of the second variable gain amplifier 16, a second variable gain amplifier 42 that sets the amplitude of the I-signal $\sin(\omega_0 t)$ so that the amplitude of the I-signal $\sin(\omega_0 t)$ is a sine $\sin\theta$ of the phase shift amount $\theta$ will be described.

Figure 5:
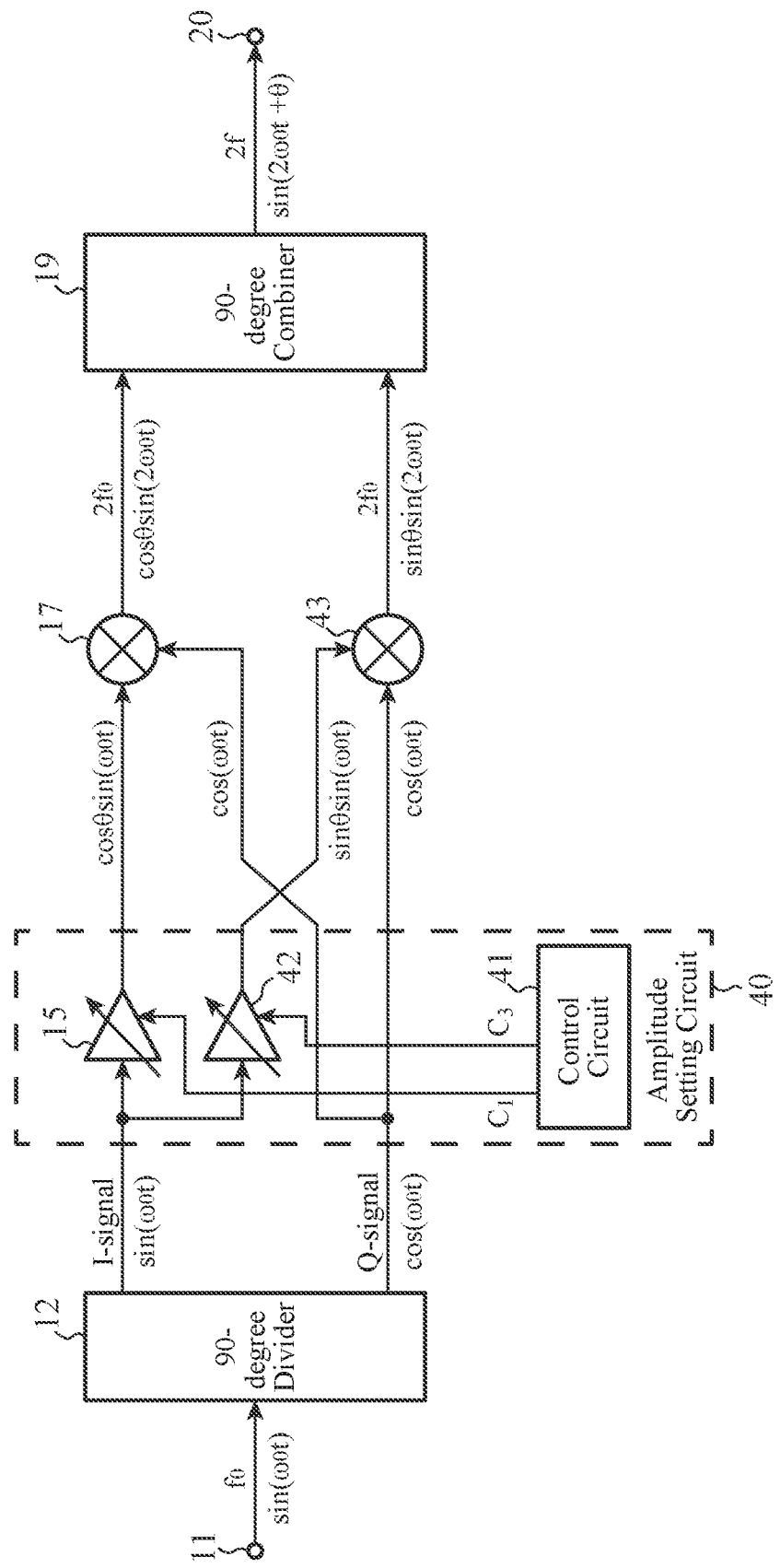
FIG. 5 is a configuration diagram illustrating a phase-variable frequency multiplier according to a second embodiment.

FIG. 5 is a configuration diagram illustrating the phase-variable frequency multiplier according to the second embodiment. In FIG. 5, reference numerals that are the same as those in FIG. 2 represent the same or corresponding components, and the description thereof will thus not be repeated.

The amplitude setting circuit 40 includes a control circuit 41, the first variable gain amplifier 15, and the second variable gain amplifier 42.

The amplitude setting circuit 40 distributes each of the I-signal $\sin(\omega_0 t)$ and the Q-signal $\cos(\omega_0 t)$ output from the 90-degree divider 12 to two paths, in a manner similar to the amplitude setting circuit 13 illustrated in FIG. 2.

One of the two I-signals $\sin(\omega_0 t)$ distributed to two paths by the amplitude setting circuit 40 is input to the first variable gain amplifier 15, and the other I-signal $\sin(\omega_0 t)$ is input to the second variable gain amplifier 42.

One of the two Q-signals $\cos(\omega_0 t)$ distributed to two paths by the amplitude setting circuit 40 is input to the first mixer 17, and the other Q-signal $\cos(\omega_0 t)$ is input to a second mixer 43, which will be described later.

The amplitude setting circuit 40 sets the amplitudes of the distributed I-signals $\sin(\omega_0 t)$ depending on the phase shift amount $\theta$ of the input signal $\sin(\omega_0 t)$.

In the phase-variable frequency multiplier illustrated in FIG. 5, all of the four signals output from the amplitude setting circuit 40, that is, not only the signals whose amplitudes are set by the amplitude setting circuit 40, will be referred to as set signals.

An internal memory of the control circuit 41 stores the phase shift amount $\theta$ of the input signal $\sin(\omega_0 t)$.

In the phase-variable frequency multiplier 1 illustrated in FIG. 5, the phase shift amount $\theta$ of the input signal $\sin(\omega_0 t)$ is stored in the internal memory of the control circuit 41. This is, however, merely an example, and the phase shift amount $\theta$ of the input signal $\sin(\omega_0 t)$ may be given from outside of the control circuit to the control circuit 41.

The control circuit 41 outputs, to the first variable gain amplifier 15, the control signal $C_1$ for controlling the first variable gain amplifier 15 so that the amplitude of the I-signal $\sin(\omega_0 t)$ is a cosine $\cos \theta$ of the phase shift amount $\theta$, in a manner similar to the control circuit 14 illustrated in FIG. 2.

The control circuit 41 outputs, to the second variable gain amplifier 42, a control signal $C_3$ for controlling the second variable gain amplifier 42 so that the amplitude of the I-signal $\sin(\omega_0 t)$ is a sine $\sin \theta$ of the phase shift amount $\theta$.

The second variable gain amplifier 42 sets the amplitude of the other of the two I-signals $\sin(\omega_0 t)$ in accordance with the control signal $C_3$ output from the control circuit 41 so that the amplitude of the other I-signal $\sin(\omega_0 t)$ is a sine $\sin \theta$ of the phase shift amount $\theta$.

The second variable gain amplifier 42 outputs the other I-signal $\sin \theta \sin(\omega_0 t)$ with the set amplitude to the second mixer 43.

The second mixer 43 multiplies the other I-signal $\sin \theta \sin(\omega_0 t)$ with the amplitude set by the second variable gain amplifier 42 by the other Q-signal $\cos(\omega_0 t)$ output from the amplitude setting circuit 40 to generate a second signal $\sin \theta \sin(2\omega_0 t)$.

The ratio $\cos \theta / \sin \theta$ of the amplitude $\cos \theta$ of the first signal $\cos \theta \sin(\omega_0 t)$ to the amplitude $\sin \theta$ of the second signal $\sin \theta \sin(2\omega_0 t)$ is a reciprocal $1/\tan \theta$ of a tangent of the phase shift amount $\theta$.

The second mixer 43 outputs the generated second signal $\sin \theta \sin(2\omega_0 t)$ to the 90-degree combiner 19.

Next, the operation of the phase-variable frequency multiplier 1 illustrated in FIG. 5 will be explained.

The 90-degree divider 12 divides the input signal $\sin(\omega_0 t)$ with the frequency $f_0$ input via the input terminal 11 into the I-signal $\sin(\omega_0 t)$ and the Q-signal $\cos(\omega_0 t)$, in a manner similar to the first embodiment.

The 90-degree divider 12 outputs each of the I-signal $\sin(\omega_0 t)$ and the Q-signal $\cos(\omega_0 t)$ to the amplitude setting circuit 40.

Upon receiving the I-signal $\sin(\omega_0 t)$ from the 90-degree divider 12, the amplitude setting circuit 40 distributes the I-signal $\sin(\omega_0 t)$ to two paths.

The amplitude setting circuit 40 outputs one of the two distributed I-signals $\sin(\omega_0 t)$ to the first variable gain amplifier 15, and the other I-signal $\sin(\omega_0 t)$ to the second variable gain amplifier 42.

Upon receiving the Q-signal $\cos(\omega_0 t)$ from the 90-degree divider 12, the amplitude setting circuit 40 distributes the Q-signal $\cos(\omega_0 t)$ to two paths.

The amplitude setting circuit 40 outputs one of the two distributed Q-signals $\cos(\omega_0 t)$ to the first mixer 17, and the other Q-signal $\cos(\omega_0 t)$ to the second mixer 43.

The control circuit 41 outputs, to the first variable gain amplifier 15, the control signal $C_1$ for controlling the first variable gain amplifier 15 so that the amplitude of the I-signal $\sin(\omega_0 t)$ is a cosine $\cos \theta$ of the phase shift amount $\theta$, in a manner similar to the control circuit 14 illustrated in FIG. 2.

The first variable gain amplifier 15 sets the amplitude of the one I-signal $\sin(\omega_0 t)$ in accordance with the control signal $C_1$ so that the amplitude of the one I-signal $\sin(\omega_0 t)$ is a cosine $\cos \theta$ of the phase shift amount $\theta$, in a manner similar to the first embodiment.

The first variable gain amplifier 15 outputs the one I-signal $\cos \theta \sin(\omega_0 t)$ with the set amplitude to the first mixer 17.

The control circuit 41 outputs, to the second variable gain amplifier 42, the control signal $C_3$ for controlling the second variable gain amplifier 42 so that the amplitude of the I-signal $\sin(\omega_0 t)$ is a sine $\sin \theta$ of the phase shift amount $\theta$.

Upon receiving the control signal $C_3$ from the control circuit 41, the second variable gain amplifier 42 sets the amplitude of the other I-signal $\sin(\omega_0 t)$ in accordance with the control signal $C_3$ so that the amplitude of the other I-signal $\sin(\omega_0 t)$ is a sine $\sin \theta$ of the phase shift amount $\theta$.

The second variable gain amplifier 42 outputs the other I-signal $\sin \theta \sin(\omega_0 t)$ with the set amplitude to the second mixer 43.

The first mixer 17 multiplies the one I-signal $\cos \theta \sin(\omega_0 t)$ by the one Q-signal $\cos(\omega_0 t)$ to generate a first signal $\cos \theta \sin(2\omega_0 t)$, in a manner similar to the first embodiment.

The first mixer 17 outputs the generated first signal $\cos \theta \sin(2\omega_0 t)$ to the 90-degree combiner 19.

Upon receiving the I-signal $\sin \theta \sin(\omega_0 t)$ from the second variable gain amplifier 42 and the Q-signal $\cos(\omega_0 t)$ from the amplitude setting circuit 40, the second mixer 43 multiplies the I-signal $\sin \theta \sin(\omega_0 t)$ by the Q-signal $\cos(\omega_0 t)$.

As a result of multiplication of the I-signal $\sin \theta \sin(\omega_0 t)$ by the Q-signal $\cos(\omega_0 t)$ by the second mixer 43, the second signal $\sin \theta \sin(2\omega_0 t)$ with the frequency $2f_0$, which is twice the frequency $f_0$ of the input signal $\sin(\omega_0 t)$, is generated.

The ratio $\cos \theta / \sin \theta$ of the amplitude $\cos \theta$ of the first signal $\cos \theta \sin(2\omega_0 t)$ generated by the first mixer 17 to the amplitude $\sin \theta$ of the second signal $\sin \theta \sin(2\omega_0 t)$ generated by the second mixer 43 is a reciprocal $1/\tan \theta$ of a tangent of the phase shift amount $\theta$.

The second mixer 43 outputs the generated second signal $\sin \theta \sin(2\omega_0 t)$ to the 90-degree combiner 19.

In a manner similar to the first embodiment, the 90-degree combiner 19 applies a phase difference of 90 degrees between the first signal $\cos \theta \sin(2\omega_0 t)$ generated by the first mixer 17 and the second signal $\sin \theta \sin(2\omega_0 t)$ generated by the second mixer 43.

In a manner similar to the first embodiment, the 90-degree combiner 19 combines the first signal with the second signal after the application of the phase difference of 90 degrees, and outputs a combined signal $\sin(2\omega_0 t + \theta)$ of the first signal and the second signal to the output terminal 20.

As described above, the phase-variable frequency multiplier 1 illustrated in FIG. 5 is capable of doubling the frequency of the input signal and shifting the phase of the input signal without degrading the phase shift resolution, in a manner similar to the phase-variable frequency multiplier 1 illustrated in FIG. 2.

In the phase-variable frequency multiplier 1 illustrated in FIG. 5, the first variable gain amplifier 15 sets the amplitude of the one I-signal $\sin(\omega_0 t)$, and the second variable gain amplifier 42 sets the amplitude of the other I-signal $\sin(\omega_0 t)$. This is, however, merely an example, and the first variable gain amplifier 15 may set the amplitude of the one Q-signal $\cos(\omega_0 t)$, and the second variable gain amplifier 42 may set the amplitude of the other Q-signal $\cos(\omega_0 t)$, as illustrated in FIG. 6.

Figure 6:
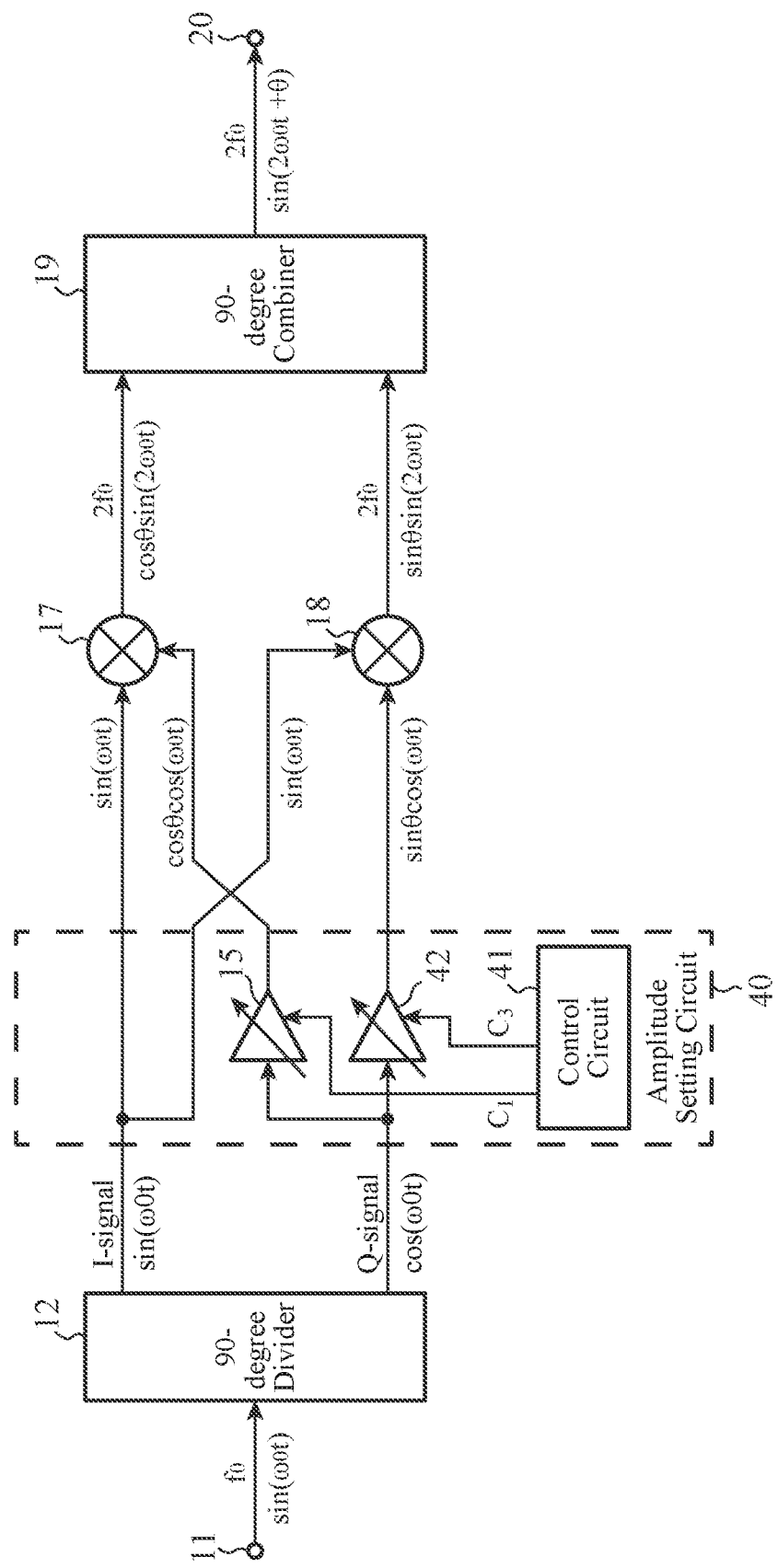
FIG. 6 is a configuration diagram illustrating another phase-variable frequency multiplier according to the second embodiment.

FIG. 6 is a configuration diagram illustrating another phase-variable frequency multiplier according to the second embodiment.

In the phase-variable frequency multiplier 1 illustrated in FIG. 6, the first variable gain amplifier 15 sets the amplitude of the one Q-signal $\cos(\omega_0 t)$ so that the amplitude of the one Q-signal $\cos(\omega_0 t)$ is a cosine $\cos\theta$ of the phase shift amount $\theta$. The second variable gain amplifier 42 sets the amplitude of the other Q-signal $\cos(\omega_0 t)$ so that the amplitude of the other Q-signal $\cos(\omega_0 t)$ is a sine $\sin\theta$ of the phase shift amount $\theta$.

The first mixer 17 multiplies the one I-signal $\sin(\omega_0 t)$ output from the amplitude setting circuit 40 by the one Q-signal $\cos\theta \cos(\omega_0 t)$ with the amplitude set by the first variable gain amplifier 15 to generate a first signal $\cos\theta \sin(2\omega_0 t)$.

The second mixer 43 multiplies the other I-signal $\sin(\omega_0 t)$ output from the amplitude setting circuit 40 by the other Q-signal $\sin\theta \cos(\omega_0 t)$ with the amplitude set by the second variable gain amplifier 42 to generate the second signal $\sin\theta \sin(2\omega_0 t)$.

Third Embodiment

In the phase-variable frequency multiplier 1 illustrated in FIG. 2, the amplitude setting circuit 13 includes the first variable gain amplifier 15 and the second variable gain amplifier 16.

In a third embodiment, a phase-variable frequency multiplier 1 in which an amplitude setting circuit 50 includes a variable gain amplifier 52 that sets the amplitude of the I-signal $\sin(\omega_0 t)$ so that the amplitude of the I-signal $\sin(\omega_0 t)$ is a tangent $\tan\theta$ of the phase shift amount $\theta$ will be described.

Figure 7:
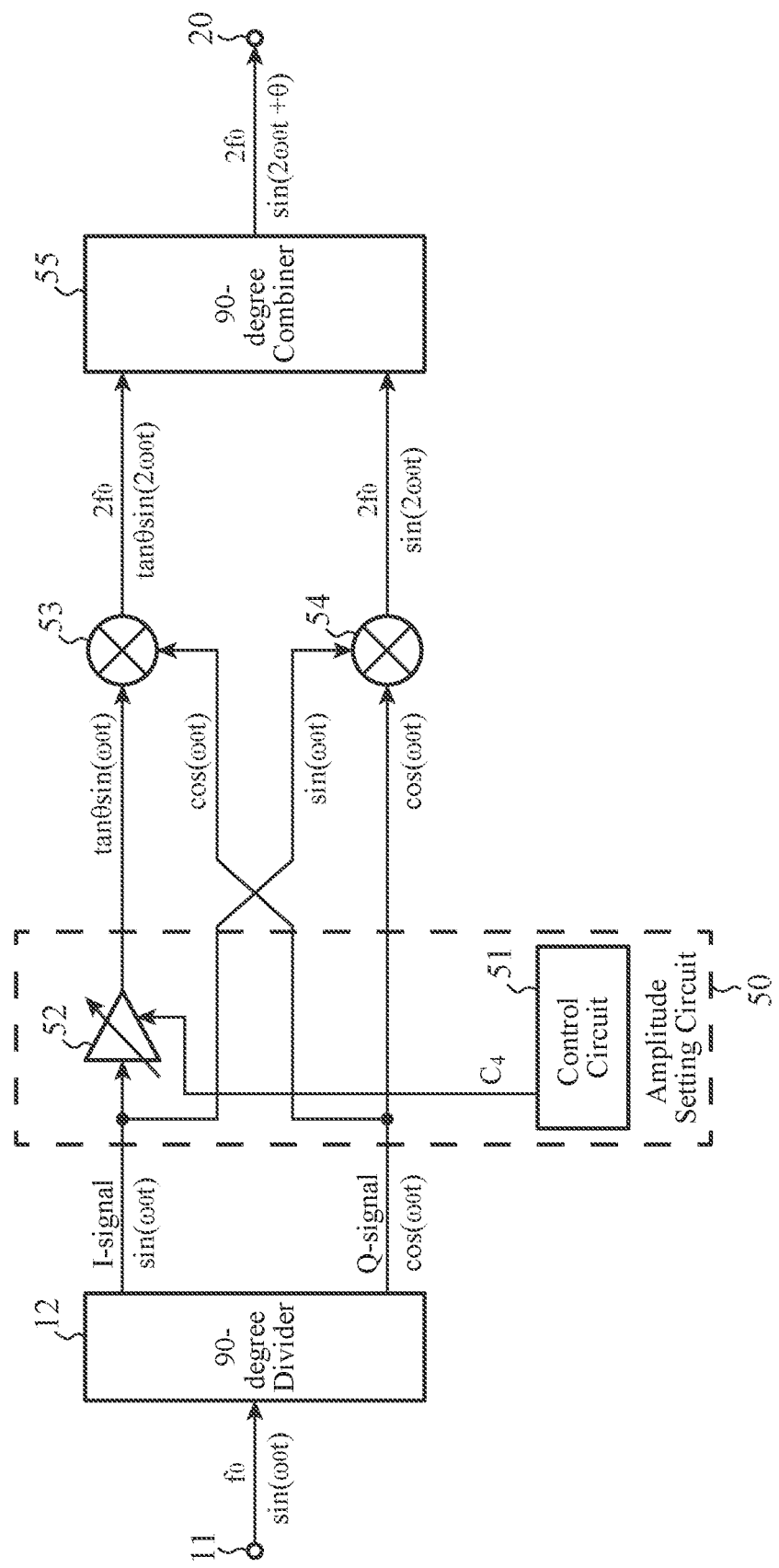
FIG. 7 is a configuration diagram illustrating a phase-variable frequency multiplier according to a third embodiment.

FIG. 7 is a configuration diagram illustrating the phase-variable frequency multiplier according to the third embodiment. In FIG. 7, reference numerals that are the same as those in FIG. 2 represent the same or corresponding components, and the description thereof will thus not be repeated.

The amplitude setting circuit 50 includes a control circuit 51 and the variable gain amplifier 52.

The amplitude setting circuit 50 distributes each of the I-signal $\sin(\omega_0 t)$ and the Q-signal $\cos(\omega_0 t)$ output from the 90-degree divider 12 to two paths, in a manner similar to the amplitude setting circuit 13 illustrated in FIG. 2.

One of the two I-signals $\sin(\omega_0 t)$ distributed to two paths by the amplitude setting circuit 50 is input to the variable gain amplifier 52, and the other I-signal $\sin(\omega_0 t)$ is input to a second mixer 54, which will be described later.

One of the two Q-signals $\cos(\omega_0 t)$ distributed to two paths by the amplitude setting circuit 50 is input to a first mixer 53, which will be described later, and the other Q-signal $\cos(\omega_0 t)$ is input to the second mixer 54.

The amplitude setting circuit 50 sets the amplitude of one of the four signals, which are the two distributed I-signals and the two distributed Q-signals, depending on the phase shift amount $\theta$ of the input signal $\sin(\omega_0 t)$.

Specifically, the amplitude setting circuit 50 sets the amplitude of one of the distributed I-signals $\sin(\omega_0 t)$ depending on the phase shift amount $\theta$ of the input signal $\sin(\omega_0 t)$.

In the phase-variable frequency multiplier illustrated in FIG. 7, all of the four signals output from the amplitude setting circuit 50, that is, not only the signal whose amplitude is set by the amplitude setting circuit 50, will be referred to as set signals.

An internal memory of the control circuit 51 stores the phase shift amount $\theta$ of the input signal $\sin(\omega_0 t)$.

In the phase-variable frequency multiplier 1 illustrated in FIG. 7, the phase shift amount $\theta$ of the input signal $\sin(\omega_0 t)$ is stored in the internal memory of the control circuit 51. This is, however, merely an example, and the phase shift amount $\theta$ of the input signal $\sin(\omega_0 t)$ may be given from outside of the control circuit to the control circuit 51.

The control circuit 51 outputs, to the variable gain amplifier 52, a control signal $C_4$ for controlling the variable gain amplifier 52 so that the amplitude of the I-signal $\sin(\omega_0 t)$ is a tangent $\tan\theta$ of the phase shift amount $\theta$.

The variable gain amplifier 52 sets the amplitude of the one I-signal $\sin(\omega_0 t)$ in accordance with the control signal $C_4$ output from the control circuit 51 so that the amplitude of the one I-signal $\sin(\omega_0 t)$ is a tangent $\tan\theta$ of the phase shift amount $\theta$.

The variable gain amplifier 52 outputs the one I-signal $\tan\theta \sin(\omega_0 t)$ with the set amplitude to the first mixer 53.

The first mixer 53 multiplies the one I-signal $\tan\theta \sin(\omega_0 t)$ with the amplitude set by the variable gain amplifier 52 by the one Q-signal $\cos(\omega_0 t)$ output from the amplitude setting circuit 50 to generate a first signal $\tan\theta \sin(2\omega_0 t)$ having a frequency $2f_0$, which is twice the frequency $f_0$ of the input signal $\sin(\omega_0 t)$.

The first mixer 53 outputs the generated first signal $\tan\theta \sin(2\omega_0 t)$ to a 90-degree combiner 55.

The second mixer 54 multiplies the other I-signal $\sin(\omega_0 t)$ output from the amplitude setting circuit 50 by the other Q-signal $\cos(\omega_0 t)$ output from the amplitude setting circuit 50 to generate a second signal $\sin(2\omega_0 t)$ having a frequency $2f_0$, which is twice the frequency $f_0$ of the input signal $\sin(\omega_0 t)$.

The ratio $\tan\theta/1$ of the amplitude $\tan\theta$ of the first signal $\tan\theta \sin(2\omega_0 t)$ to the amplitude of "1" of the second signal $\sin(2\omega_0 t)$ is a tangent $\tan\theta$ of the phase shift amount $\theta$.

The second mixer 54 outputs the generated second signal $\sin(2\omega_0 t)$ to the 90-degree combiner 55.

The 90-degree combiner 55 applies a phase difference of 90 degrees between the first signal $\tan\theta \sin(2\omega_0 t)$ generated by the first mixer 53 and the second signal $\sin(2\omega_0 t)$ generated by the second mixer 54, and combines the first signal having a phase difference of 90 degrees from the second signal with the second signal.

The 90-degree combiner 55 outputs the combined signal $\sin(2\omega_0 t + \theta)$ of the first signal and the second signal to the output terminal 20.

The frequency of the combined signal $\sin(2\omega_0 t + \theta)$ is $2f_0$, and the phase difference between the combined signal $\sin(2\omega_0 t + \theta)$ and the input signal $\sin(\omega_0 t)$ is $\theta$.

Next, the operation of the phase-variable frequency multiplier 1 illustrated in FIG. 7 will be explained.

The 90-degree divider 12 divides the input signal $\sin(\omega_0 t)$ with the frequency $f_0$ input via the input terminal 11 into the I-signal $\sin(\omega_0 t)$ and the Q-signal $\cos(\omega_0 t)$, in a manner similar to the first embodiment.

The 90-degree divider 12 outputs each of the I-signal $\sin(\omega_0 t)$ and the Q-signal $\cos(\omega_0 t)$ to the amplitude setting circuit 50.

Upon receiving the I-signal $\sin(\omega_0 t)$ from the 90-degree divider 12, the amplitude setting circuit 50 distributes the I-signal $\sin(\omega_0 t)$ to two paths.

The amplitude setting circuit 50 outputs one of the two distributed I-signals $\sin(\omega_0 t)$ to the variable gain amplifier 52, and the other I-signal $\sin(\omega_0 t)$ to the second mixer 54.

Upon receiving the Q-signal $\cos(\omega_0 t)$ from the 90-degree divider 12, the amplitude setting circuit 50 distributes the Q-signal $\cos(\omega_0 t)$ to two paths.

The amplitude setting circuit 50 outputs one of the two distributed Q-signals $\cos(\omega_0 t)$ to the first mixer 53, and the other Q-signal $\cos(\omega_0 t)$ to the second mixer 54.

The control circuit 51 outputs, to the variable gain amplifier 52, the control signal $C_4$ for controlling the variable gain amplifier 52 so that the amplitude of the I-signal $\sin(\omega_0 t)$ is a tangent $\tan\theta$ of the phase shift amount $\theta$.

Upon receiving the control signal $C_4$ from the control circuit 51, the variable gain amplifier 52 sets the amplitude of the one I-signal $\sin(\omega_0 t)$ in accordance with the control signal $C_4$ so that the amplitude of the one I-signal $\sin(\omega_0 t)$ is a tangent $\tan\theta$ of the phase shift amount $\theta$.

The variable gain amplifier 52 outputs the one I-signal $\tan\theta \sin(\omega_0 t)$ with the set amplitude to the first mixer 53.

Upon receiving the I-signal $\tan\theta \sin(\omega_0 t)$ from the variable gain amplifier 52 and the Q-signal $\cos(\omega_0 t)$ from the amplitude setting circuit 50, the first mixer 53 multiplies the I-signal $\tan\theta \sin(\omega_0 t)$ by the Q-signal $\cos(\omega_0 t)$.

As a result of multiplication of the I-signal $\tan\theta \sin(\omega_0 t)$ by the Q-signal $\cos(\omega_0 t)$ by the first mixer 53, the first signal $\tan\theta \sin(2\omega_0 t)$ with the frequency $2f_0$, which is twice the frequency $f_0$ of the input signal $\sin(\omega_0 t)$, is generated.

The first mixer 53 outputs the generated first signal $\tan\theta \sin(2\omega_0 t)$ to a 90-degree combiner 55.

Upon receiving the I-signal $\sin(\omega_0 t)$ from the amplitude setting circuit 50 and the Q-signal $\cos(\omega_0 t)$ from the amplitude setting circuit 50, the second mixer 54 multiplies the I-signal $\sin(\omega_0 t)$ by the Q-signal $\cos(\omega_0 t)$.

As a result of multiplication of the I-signal $\sin(\omega_0 t)$ by the Q-signal $\cos(\omega_0 t)$ by the second mixer 54, the second signal $\sin(2\omega_0 t)$ with the frequency $2f_0$, which is twice the frequency $f_0$ of the input signal $\sin(\omega_0 t)$, is generated.

The ratio $\tan\theta/1$ of the amplitude $\tan\theta$ of the first signal $\tan\theta \sin(2\omega_0 t)$ generated by the first mixer 53 to the amplitude of "1" of the second signal $\sin(2\omega_0 t)$ generated by the second mixer 54 is a tangent $\tan\theta$ of the phase shift amount $\theta$.

The second mixer 54 outputs the generated second signal $\sin(2\omega_0 t)$ to the 90-degree combiner 55.

The 90-degree combiner 55 applies a phase difference of 90 degrees between the first signal $\tan\theta \sin(2\omega_0 t)$ generated by the first mixer 53 and the second signal $\sin(2\omega_0 t)$ generated by the second mixer 54.

In a manner similar to the 90-degree combiner 19 illustrated in FIG. 2, the 90-degree combiner 55 combines the first signal with the second signal after the application of the phase difference of 90 degrees, and outputs a combined signal $\sin(2\omega_0 t+\theta)$ of the first signal and the second signal to the output terminal 20.

As described above, the phase-variable frequency multiplier 1 illustrated in FIG. 7 is capable of doubling the frequency of the input signal and shifting the phase of the input signal without degrading the phase shift resolution, in a manner similar to the phase-variable frequency multiplier 1 illustrated in FIG. 2.

In the phase-variable frequency multiplier 1 illustrated in FIG. 7, the variable gain amplifier 52 sets the amplitude of the one I-signal $\sin(\omega_0 t)$. This is, however, merely an example, and the variable gain amplifier 52 may set the amplitude of the other I-signal $\sin(\omega_0 t)$ so that the amplitude of the other I-signal $\sin(\omega_0 t)$ is a tangent $\tan\theta$ of the phase shift amount $\theta$, as illustrated in FIG. 8.

Figure 8:
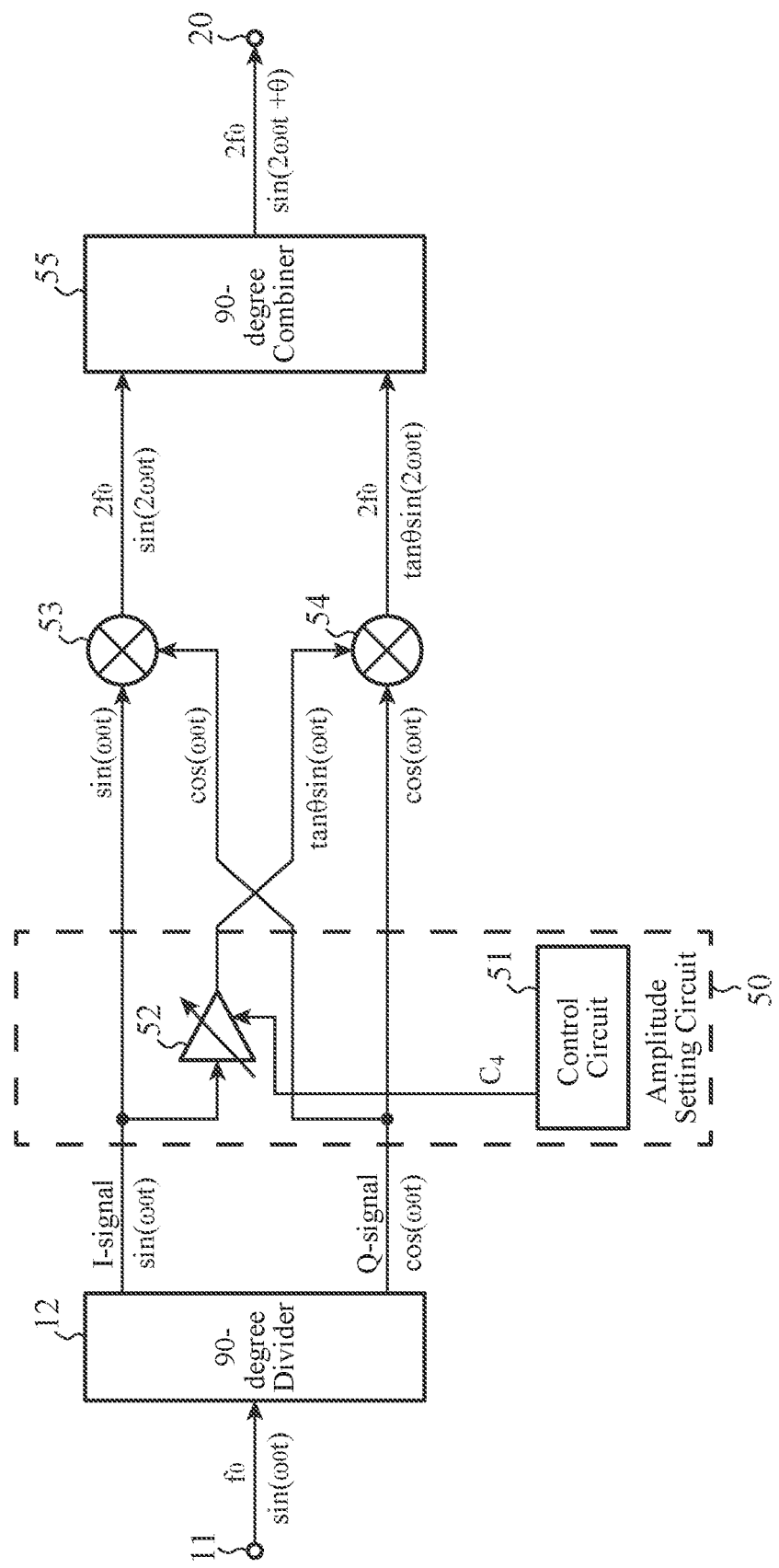
FIG. 8 is a configuration diagram illustrating another phase-variable frequency multiplier according to the third embodiment.

FIG. 8 is a configuration diagram illustrating another phase-variable frequency multiplier according to the third embodiment.

In the phase-variable frequency multiplier 1 illustrated in FIG. 8, the first mixer 53 multiplies the one I-signal $\sin(\omega_0 t)$ output from the amplitude setting circuit 50 by the one Q-signal $\cos(\omega_0 t)$ output from the amplitude setting circuit 50 to generate a first signal $\sin(2\omega_0 t)$.

The second mixer 54 multiplies the other I-signal $\tan\theta \sin(\omega_0 t)$ with the amplitude set by the variable gain amplifier 52 by the other Q-signal $\cos(\omega_0 t)$ output from the amplitude setting circuit 50 to generate a second signal $\tan\theta \sin(2\omega_0 t)$.

The ratio $1/\tan\theta$ of the amplitude of "1" of the first signal $\sin(2\omega_0 t)$ generated by the first mixer 53 to the amplitude $\tan\theta$ of the second signal $\tan\theta \sin(2\omega_0 t)$ generated by the second mixer 54 is a reciprocal $1/\tan\theta$ of a tangent of the phase shift amount $\theta$.

Figure 9:
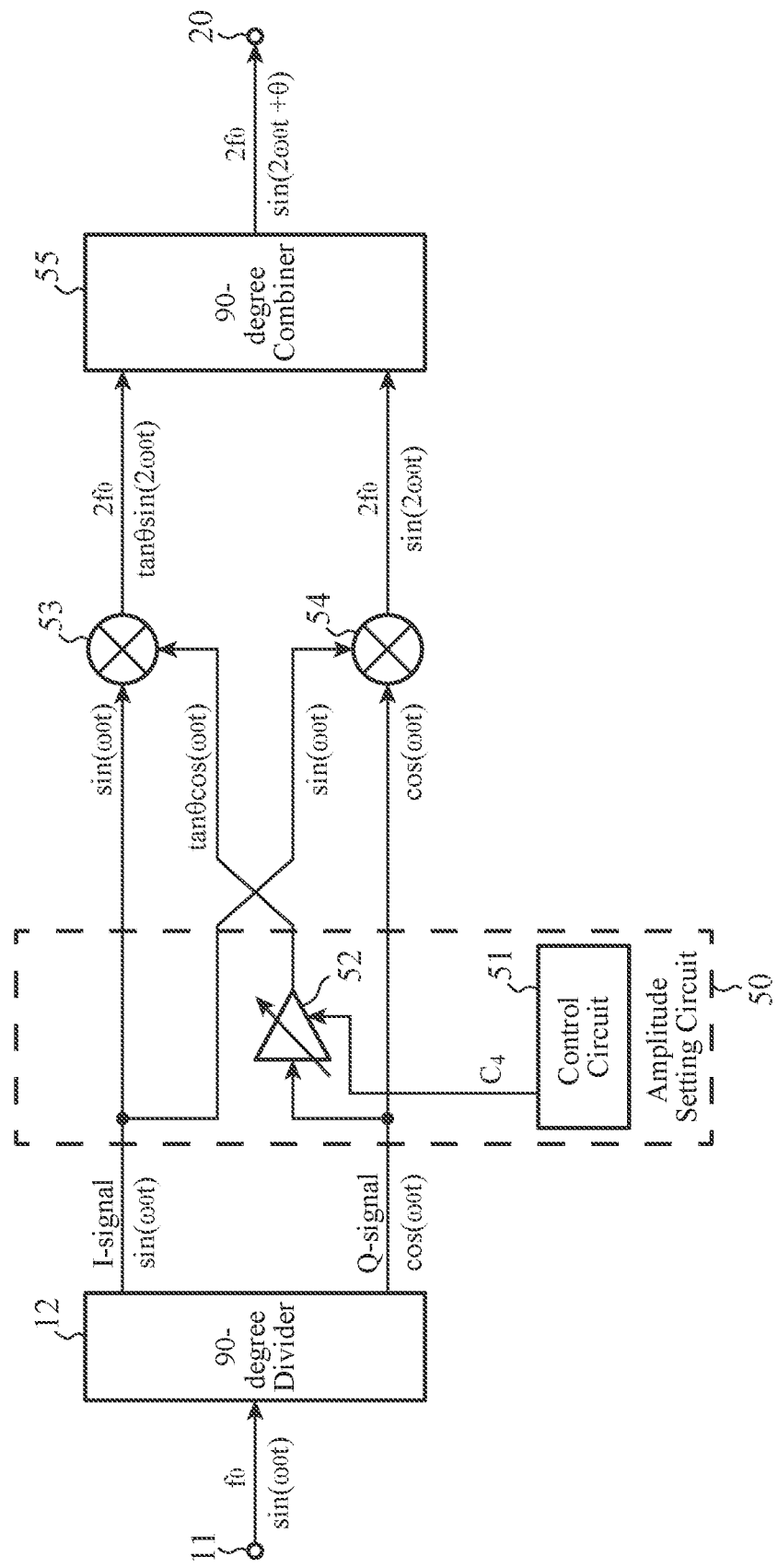
FIG. 9 is a configuration diagram illustrating still another phase-variable frequency multiplier according to the third embodiment.

Alternatively, as illustrated in FIG. 9, the variable gain amplifier 52 may set the amplitude of the one Q-signal $\cos(\omega_0 t)$ so that the amplitude of the one Q-signal $\cos(\omega_0 t)$ is a tangent $\tan\theta$ of the phase shift amount $\theta$.

FIG. 9 is a configuration diagram illustrating another phase-variable frequency multiplier according to the third embodiment.

In the phase-variable frequency multiplier 1 illustrated in FIG. 9, the first mixer 53 multiplies the one I-signal $\sin(\omega_0 t)$ output from the amplitude setting circuit 50 by the one Q-signal $\tan\theta \cos(\omega_0 t)$ with the amplitude set by the variable gain amplifier 52 to generate a first signal $\tan\theta \sin(2\omega_0 t)$.

The second mixer 54 multiplies the other I-signal $\sin(\omega_0 t)$ output from the amplitude setting circuit 50 by the other Q-signal $\cos(\omega_0 t)$ output from the amplitude setting circuit 50 to generate a second signal $\sin(2\omega_0 t)$.

The ratio $\tan\theta/1$ of the amplitude $\tan\theta$ of the first signal $\tan\theta \sin(2\omega_0 t)$ generated by the first mixer 53 to the amplitude of "1" of the second signal $\sin(2\omega_0 t)$ generated by the second mixer 54 is a tangent $\tan\theta$ of the phase shift amount $\theta$.

Figure 10:
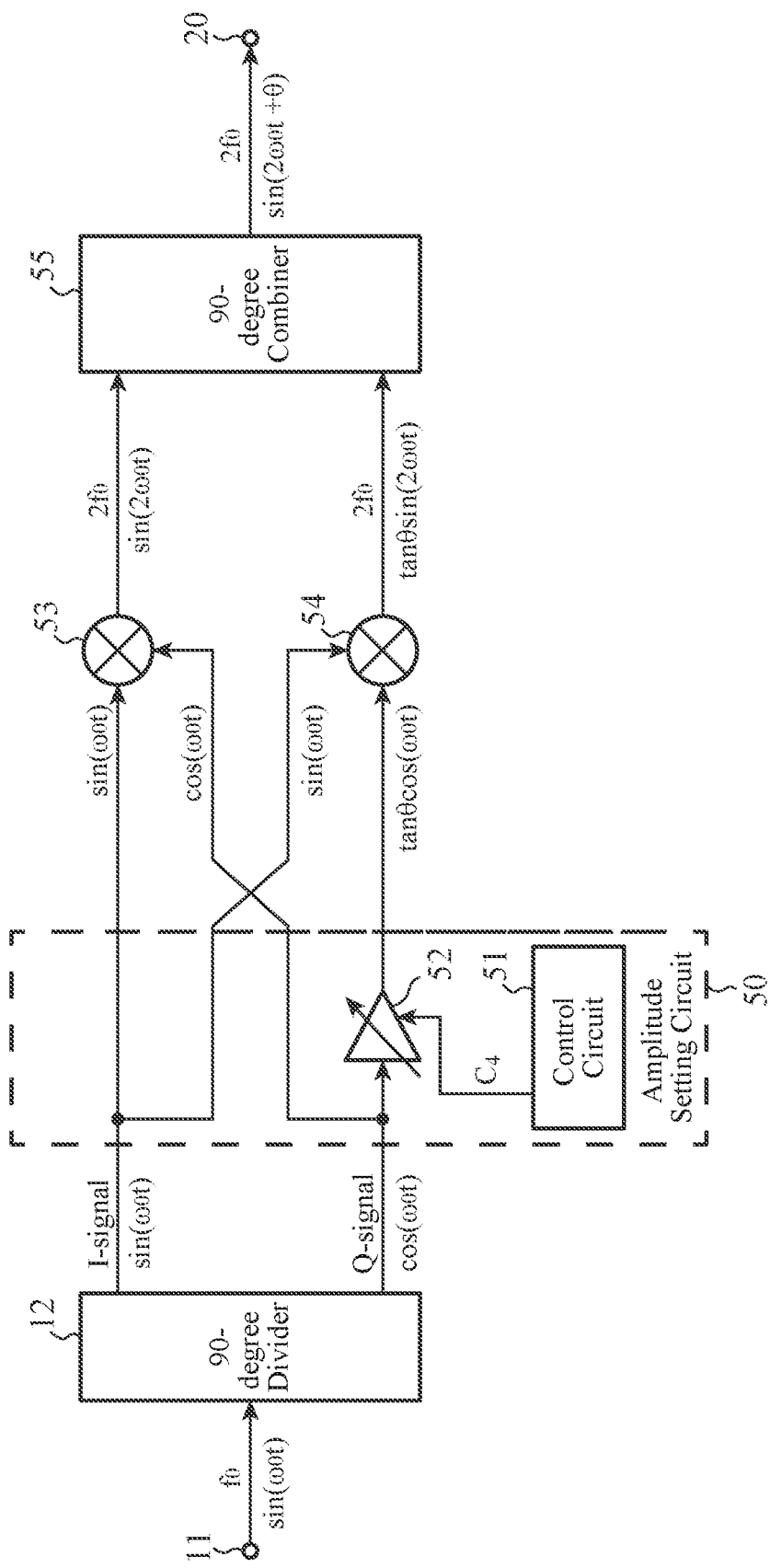
FIG. 10 is a configuration diagram illustrating another phase-variable frequency multiplier according to the third embodiment.

Alternatively, as illustrated in FIG. 10, the variable gain amplifier 52 may set the amplitude of the other Q-signal $\cos(\omega_0 t)$ so that the amplitude of the other Q-signal $\cos(\omega_0 t)$ is a tangent $\tan\theta$ of the phase shift amount $\theta$.

FIG. 10 is a configuration diagram illustrating another phase-variable frequency multiplier according to the third embodiment.

In the phase-variable frequency multiplier 1 illustrated in FIG. 10, the first mixer 53 multiplies the one I-signal $\sin(\omega_0 t)$ output from the amplitude setting circuit 50 by the one Q-signal $\cos(\omega_0 t)$ output from the amplitude setting circuit 50 to generate a first signal $\sin(2\omega_0 t)$.

The second mixer 54 multiplies the other I-signal $\sin(\omega_0 t)$ output from the amplitude setting circuit 50 by the other Q-signal $\tan\theta \cos(\omega_0 t)$ with the amplitude set by the variable gain amplifier 52 to generate a second signal $\tan\theta \sin(2\omega_0 t)$.

The ratio $1/\tan\theta$ of the amplitude of "1" of the first signal $\sin(2\omega_0 t)$ generated by the first mixer 53 to the amplitude $\tan\theta$ of the second signal $\tan\theta \sin(2\omega_0 t)$ generated by the second mixer 54 is a reciprocal $1/\tan\theta$ of a tangent of the phase shift amount $\theta$.

Fourth Embodiment

In the phase-variable frequency multiplier 1 illustrated in FIG. 2, the amplitude setting circuit 13 includes the first variable gain amplifier 15 and the second variable gain amplifier 16.

In a fourth embodiment, a phase-variable frequency multiplier 1 in which an amplitude setting circuit 60 includes a first variable gain amplifier 62 and a second variable gain amplifier 63 instead of the first variable gain amplifier 15 and the second variable gain amplifier 16 will be described.

Figure 11:
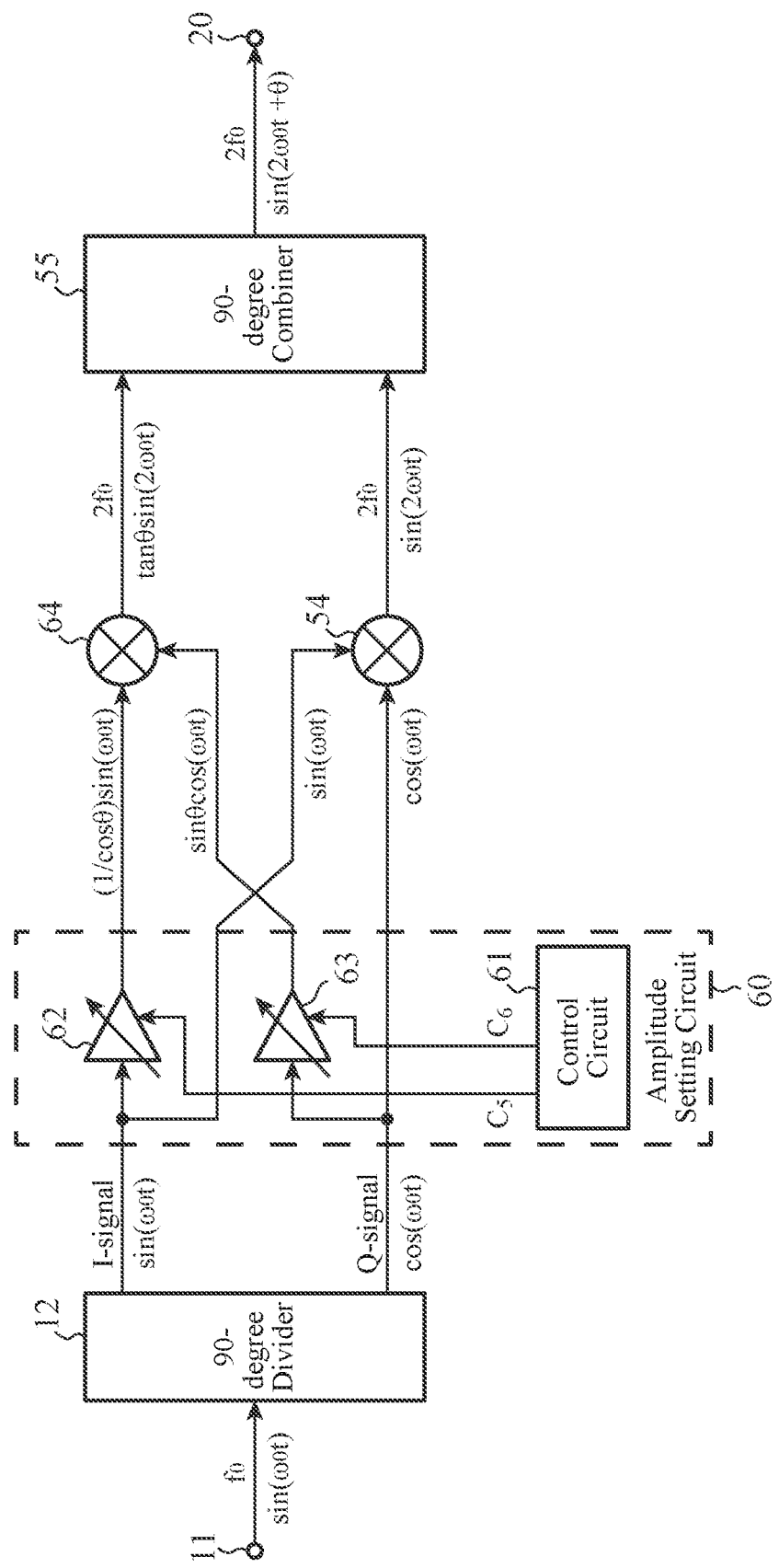
FIG. 11 is a configuration diagram illustrating a phase-variable frequency multiplier according to a fourth embodiment.

FIG. 11 is a configuration diagram illustrating the phase-variable frequency multiplier according to the fourth embodiment. In FIG. 11, reference numerals that are the same as those in FIGS. 2 and 7 represent the same or corresponding components, and the description thereof will thus not be repeated.

The amplitude setting circuit 60 includes a control circuit 61, the first variable gain amplifier 62, and the second variable gain amplifier 63.

The amplitude setting circuit 60 distributes each of the I-signal $\sin(\omega_0 t)$ and the Q-signal $\cos(\omega_0 t)$ output from the 90-degree divider 12 to two paths, in a manner similar to the amplitude setting circuit 13 illustrated in FIG. 2.

One of the two I-signals $\sin(\omega_0 t)$ distributed to two paths by the amplitude setting circuit 60 is input to the first variable gain amplifier 62, and the other I-signal $\sin(\omega_0 t)$ is input to the second mixer 54.

One of the two Q-signals $\cos(\omega_0 t)$ distributed to two paths by the amplitude setting circuit 60 is input to the second variable gain amplifier 63, and the other Q-signal $\cos(\omega_0 t)$ is input to the second mixer 54.

The amplitude setting circuit 60 sets the amplitude of one of the distributed I-signals $\sin(\omega_0 t)$ depending on the phase shift amount $\theta$ of the input signal $\sin(\omega_0 t)$, and the amplitude of one of the distributed Q-signal $\cos(\omega_0 t)$ depending on the phase shift amount $\theta$ of the input signal $\sin(\omega_0 t)$.

In the phase-variable frequency multiplier illustrated in FIG. 11, all of the four signals output from the amplitude setting circuit 60, that is, not only the signals whose amplitudes are set by the amplitude setting circuit 60, will be referred to as set signals.

An internal memory of the control circuit 61 stores the phase shift amount $\theta$ of the input signal $\sin(\omega_0 t)$.

In the phase-variable frequency multiplier 1 illustrated in FIG. 11, the phase shift amount $\theta$ of the input signal $\sin(\omega_0 t)$ is stored in the internal memory of the control circuit 61. This is, however, merely an example, and the phase shift amount $\theta$ of the input signal $\sin(\omega_0 t)$ may be given from outside to the control circuit 61.

The control circuit 61 outputs, to the first variable gain amplifier 62, a control signal $C_5$ for controlling the first variable gain amplifier 62 so that the amplitude of the I-signal $\sin(\omega_0 t)$ is a reciprocal $1/\cos\theta$ of a cosine of the phase shift amount $\theta$.

The control circuit 61 outputs, to the second variable gain amplifier 63, a control signal $C_6$ for controlling the second variable gain amplifier 63 so that the amplitude of the Q-signal $\cos(\omega_0 t)$ is a sine $\sin\theta$ of the phase shift amount $\theta$.

The first variable gain amplifier 62 sets the amplitude of the one I-signal $\sin(\omega_0 t)$ in accordance with the control signal $C_5$ output from the control circuit 61 so that the amplitude of the I-signal $\sin(\omega_0 t)$ is a reciprocal $1/\cos\theta$ of a cosine of the phase shift amount $\theta$.

The first variable gain amplifier 62 outputs the one I-signal $(1/\cos\theta)\sin(\omega_0 t)$ with the set amplitude to the first mixer 64.

The second variable gain amplifier 63 sets the amplitude of the one Q-signal $\cos(\omega_0 t)$ in accordance with the control signal $C_6$ output from the control circuit 61 so that the amplitude of the one Q-signal $\cos(\omega_0 t)$ is a sine $\sin\theta$ of the phase shift amount $\theta$.

The second variable gain amplifier 63 outputs the one Q-signal $\sin\theta\cos(\omega_0 t)$ with the set amplitude to the first mixer 64.

The first mixer 64 multiplies the one I-signal $(1/\cos\theta)\sin(\omega_0 t)$ with the amplitude set by the first variable gain amplifier 62 by the one Q-signal $\sin\theta\cos(\omega_0 t)$ with the amplitude set by the second variable gain amplifier 63 to generate a first signal $\tan\theta\sin(2\omega_0 t)$ having a frequency $2f_0$, which is twice the frequency $f_0$ of the input signal $\sin(\omega_0 t)$.

The first mixer 64 outputs the generated first signal $\tan\theta\sin(2\omega_0 t)$ to a 90-degree combiner 55.

Next, the operation of the phase-variable frequency multiplier 1 illustrated in FIG. 11 will be explained.

The 90-degree divider 12 divides the input signal $\sin(\omega_0 t)$ with the frequency $f_0$ input via the input terminal 11 into the I-signal $\sin(\omega_0 t)$ and the Q-signal $\cos(\omega_0 t)$, in a manner similar to the first embodiment.

The 90-degree divider 12 outputs each of the I-signal $\sin(\omega_0 t)$ and the Q-signal $\cos(\omega_0 t)$ to the amplitude setting circuit 60.

Upon receiving the I-signal $\sin(\omega_0 t)$ from the 90-degree divider 12, the amplitude setting circuit 60 distributes the I-signal $\sin(\omega_0 t)$ to two paths.

The amplitude setting circuit 60 outputs one of the two distributed I-signals $\sin(\omega_0 t)$ to the first variable gain amplifier 62, and the other I-signal $\sin(\omega_0 t)$ to the second mixer 54.

Upon receiving the Q-signal $\cos(\omega_0 t)$ from the 90-degree divider 12, the amplitude setting circuit 60 distributes the Q-signal $\cos(\omega_0 t)$ to two paths.

The amplitude setting circuit 60 outputs one of the two distributed Q-signals $\cos(\omega_0 t)$ to the second variable gain amplifier 63, and the other Q-signal $\cos(\omega_0 t)$ to the second mixer 54.

The control circuit 61 outputs, to the first variable gain amplifier 62, the control signal $C_5$ for controlling the first variable gain amplifier 62 so that the amplitude of the I-signal $\sin(\omega_0 t)$ is a reciprocal $1/\cos\theta$ of a cosine of the phase shift amount $\theta$.

Upon receiving the control signal $C_5$ from the control circuit 61, the first variable gain amplifier 62 sets the amplitude of the one I-signal $\sin(\omega_0 t)$ in accordance with the control signal $C_5$ so that the amplitude of the one I-signal $\sin(\omega_0 t)$ is a reciprocal $1/\cos\theta$ of a cosine of the phase shift amount $\theta$.

The first variable gain amplifier 62 outputs the one I-signal $(1/\cos\theta)\sin(\omega_0 t)$ with the set amplitude to the first mixer 64.

The control circuit 61 outputs, to the second variable gain amplifier 63, the control signal $C_6$ for controlling the second variable gain amplifier 63 so that the amplitude of the Q-signal $\cos(\omega_0 t)$ is a sine $\sin\theta$ of the phase shift amount $\theta$.

Upon receiving the control signal $C_6$ from the control circuit 61, the second variable gain amplifier 63 sets the amplitude of the one Q-signal $\cos(\omega_0 t)$ in accordance with the control signal $C_6$ so that the amplitude of the one Q-signal $\cos(\omega_0 t)$ is a sine $\sin\theta$ of the phase shift amount $\theta$.

The second variable gain amplifier 63 outputs the one Q-signal $\sin\theta\cos(\omega_0 t)$ with the set amplitude to the first mixer 64.

Upon receiving the I-signal $(1/\cos\theta)\sin(\omega_0 t)$ from the first variable gain amplifier 62 and the Q-signal $\sin\theta\cos(\omega_0 t)$ from the second variable gain amplifier 63, the first mixer 64 multiplies the I-signal $(1/\cos\theta)\sin(\omega_0 t)$ by the Q-signal $\sin\theta\cos(\omega_0 t)$.

As a result of multiplication of the I-signal $(1/\cos\theta)\sin(\omega_0 t)$ by the Q-signal $\sin\theta\cos(\omega_0 t)$ by the first mixer 64, the first signal tan θ sin(2ω₀t) with the frequency 2f₀, which is twice the frequency f₀ of the input signal sin(ω₀t), is generated.

The first mixer 64 outputs the generated first signal tan θ sin(2ω₀t) to a 90-degree combiner 55.

The second mixer 54 multiplies the other I-signal sin(ω₀t) by the other Q-signal cos(ω₀t) to generate a second signal sin(2ω₀t) in a manner similar to the third embodiment.

The second mixer 54 outputs the generated second signal sin(2ω₀t) to the 90-degree combiner 55.

In a manner similar to the third embodiment, the 90-degree combiner 55 applies a phase difference of 90 degrees between the first signal tan θ sin(2ω₀t) generated by the first mixer 64 and the second signal sin(2ω₀t) generated by the second mixer 54.

In a manner similar to the third embodiment, the 90-degree combiner 55 combines the first signal with the second signal after the application of the phase difference of 90 degrees, and outputs a combined signal sin(2ω₀t+θ) of the first signal and the second signal to the output terminal 20.

As described above, the phase-variable frequency multiplier 1 illustrated in FIG. 11 is capable of doubling the frequency of the input signal and shifting the phase of the input signal without degrading the phase shift resolution, in a manner similar to the phase-variable frequency multiplier 1 illustrated in FIG. 1.

In the phase-variable frequency multiplier 1 illustrated in FIG. 11, the first variable gain amplifier 62 sets the amplitude of the one I-signal sin(ω₀t), and the second variable gain amplifier 63 sets the amplitude of the one Q-signal cos(ω₀t). This is, however, merely an example, and the first variable gain amplifier 62 may set the amplitude of the other I-signal sin(ω₀t), and the second variable gain amplifier 63 may set the amplitude of the other Q-signal cos(ω₀t), as illustrated in FIG. 12.

Figure 12:
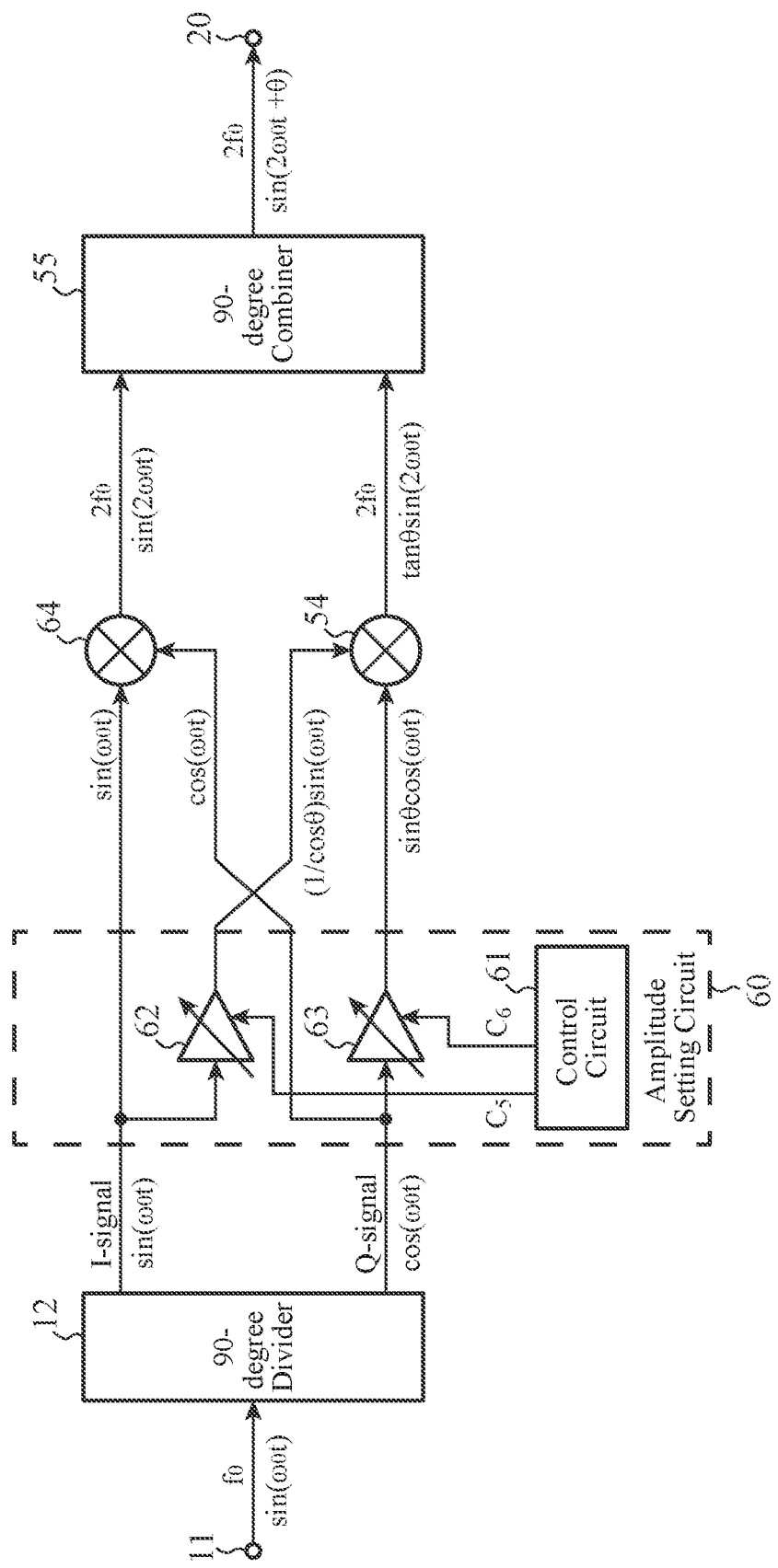
FIG. 12 is a configuration diagram illustrating another phase-variable frequency multiplier according to the fourth embodiment.

FIG. 12 is a configuration diagram illustrating another phase-variable frequency multiplier according to the fourth embodiment.

In the phase-variable frequency multiplier 1 illustrated in FIG. 12, the first variable gain amplifier 62 sets the amplitude of the other I-signal sin(ω₀t) so that the amplitude of the other I-signal sin(ω₀t) is a reciprocal 1/cos θ of a cosine of the phase shift amount θ. The second variable gain amplifier 63 sets the amplitude of the other Q-signal cos(ω₀t) so that the amplitude of the other Q-signal cos(ω₀t) is a sine sin θ of the phase shift amount θ.

The first mixer 64 multiplies the one I-signal sin(ω₀t) output from the amplitude setting circuit 60 by the one Q-signal cos(ω₀t) output from the amplitude setting circuit 60 to generate a first signal sin(2ω₀t).

The second mixer 54 multiplies the other I-signal (1/cos θ)sin(ω₀t) with the amplitude set by the first variable gain amplifier 62 by the other Q-signal sin θ cos(ω₀t) with the amplitude set by the second variable gain amplifier 63 to generate a second signal tan θ sin(2ω₀t).

The ratio 1/tan θ of the amplitude of "1" of the first signal sin(2ω₀t) generated by the first mixer 64 to the amplitude tan θ of the second signal tan θ sin(2ω₀t) generated by the second mixer 54 is a reciprocal 1/tan θ of a tangent of the phase shift amount θ.

Fifth Embodiment

In the phase-variable frequency multiplier 1 illustrated in FIG. 2, the amplitude setting circuit 13 includes the first variable gain amplifier 15 and the second variable gain amplifier 16.

In a fifth embodiment, a phase-variable frequency multiplier 1 in which an amplitude setting circuit 70 includes a first variable gain amplifier 72, a second variable gain amplifier 73, a third variable gain amplifier 74, and a fourth variable gain amplifier 75 will be described.

Figure 13:
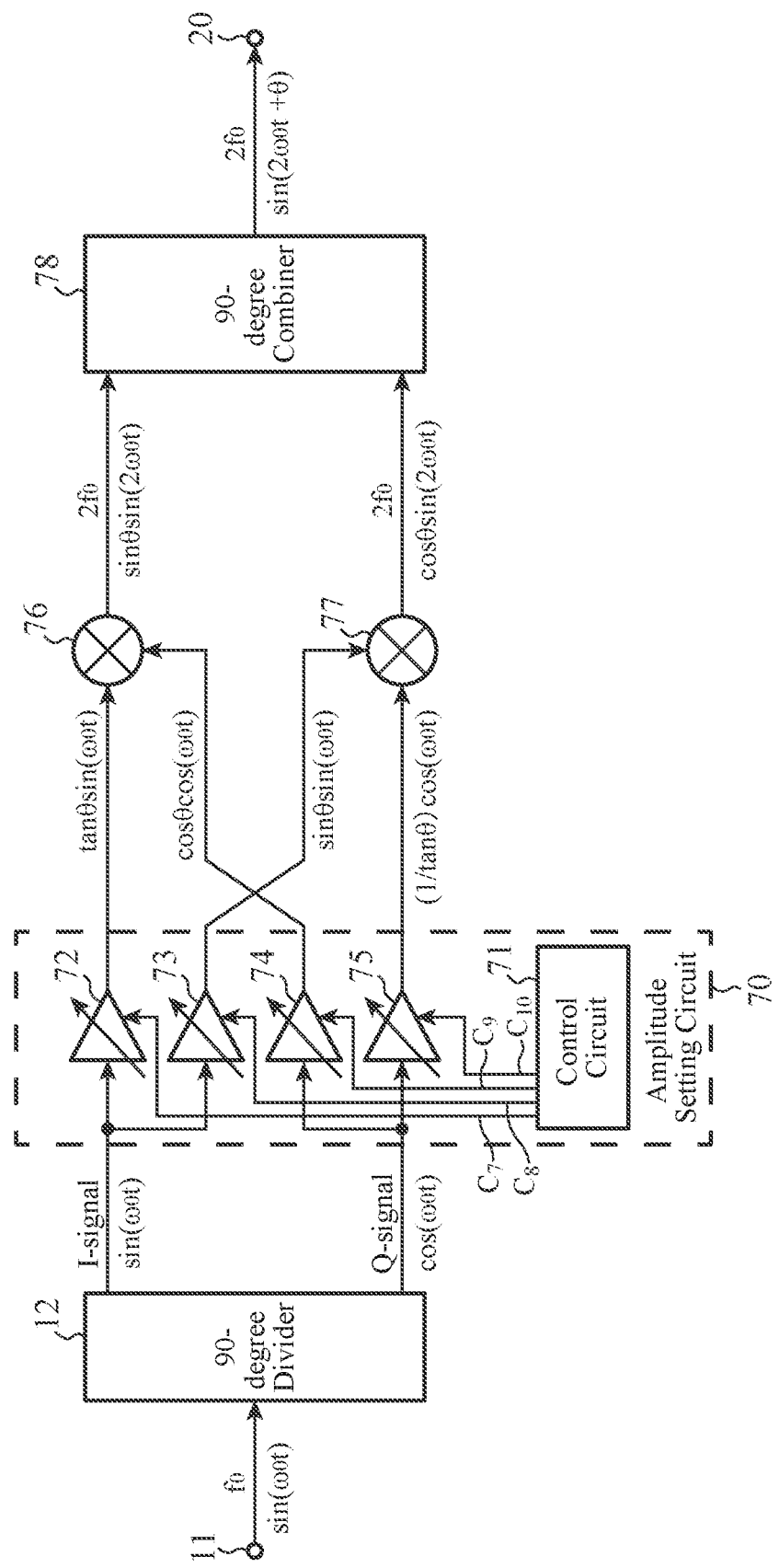
FIG. 13 is a configuration diagram illustrating a phase-variable frequency multiplier according to a fifth embodiment.

FIG. 13 is a configuration diagram illustrating the phase-variable frequency multiplier according to the fifth embodiment. In FIG. 13, reference numerals that are the same as those in FIG. 2 represent the same or corresponding components, and the description thereof will thus not be repeated.

The amplitude setting circuit 70 includes a control circuit 71, the first variable gain amplifier 72, the second variable gain amplifier 73, the third variable gain amplifier 74, and the fourth variable gain amplifier 75.

The amplitude setting circuit 70 distributes each of the I-signal sin(ω₀t) and the Q-signal cos(ω₀t) output from the 90-degree divider 12 to two paths, in a manner similar to the amplitude setting circuit 13 illustrated in FIG. 2.

One of the two I-signals sin(ω₀t) distributed to two paths by the amplitude setting circuit 70 is input to the first variable gain amplifier 72, and the other I-signal sin(ω₀t) is input to the second variable gain amplifier 73.

One of the two Q-signals cos(ω₀t) distributed to two paths by the amplitude setting circuit 70 is input to the third variable gain amplifier 74, and the other Q-signal cos(ω₀t) is input to the fourth variable gain amplifier 75.

The amplitude setting circuit 70 sets the amplitude of each of the distributed I-signals sin(ω₀t) depending on the phase shift amount θ of the input signal sin(ω₀t), and the amplitude of each of the distributed Q-signal cos(ω₀t) depending on the phase shift amount θ of the input signal sin(ω₀t).

In the phase-variable frequency multiplier illustrated in FIG. 13, all of the four signals output from the amplitude setting circuit 70 will be referred to as set signals.

An internal memory of the control circuit 71 stores the phase shift amount θ of the input signal sin(ω₀t).

In the phase-variable frequency multiplier 1 illustrated in FIG. 13, the phase shift amount θ of the input signal sin(ω₀t) is stored in the internal memory of the control circuit 71. This is, however, merely an example, and the phase shift amount θ of the input signal sin(ω₀t) may be given from outside of the control circuit to the control circuit 71.

The control circuit 71 outputs, to the first variable gain amplifier 72, a control signal $C_7$ for controlling the first variable gain amplifier 72 so that the amplitude of the I-signal sin(ω₀t) is a tangent tan θ of the phase shift amount θ.

The control circuit 71 outputs, to the second variable gain amplifier 73, a control signal $C_8$ for controlling the second variable gain amplifier 73 so that the amplitude of the I-signal sin(ω₀t) is a sine sin θ of the phase shift amount θ.

The control circuit 71 outputs, to the third variable gain amplifier 74, a control signal $C_9$ for controlling the third variable gain amplifier 74 so that the amplitude of the Q-signal cos(ω₀t) is a cosine cos θ of the phase shift amount θ.

The control circuit 71 outputs, to the fourth variable gain amplifier 75, a control signal $C_{10}$ for controlling the fourth variable gain amplifier 75 so that the amplitude of the Q-signal cos(ω₀t) is a reciprocal 1/tan θ of a tangent of the phase shift amount θ.

The first variable gain amplifier 72 sets the amplitude of the one I-signal sin(ω₀t) in accordance with the control signal $C_7$ output from the control circuit 71 so that the amplitude of the one I-signal sin(ω₀t) is a tangent tan θ of the phase shift amount θ.

The first variable gain amplifier 72 outputs the one I-signal $\tan\theta \sin(\omega_0 t)$ with the set amplitude to the first mixer 76.

The second variable gain amplifier 73 sets the amplitude of the other I-signal $\sin(\omega_0 t)$ in accordance with the control signal $C_8$ output from the control circuit 71 so that the amplitude of the other I-signal $\sin(\omega_0 t)$ is a sine $\sin\theta$ of the phase shift amount $\theta$.

The second variable gain amplifier 73 outputs the other I-signal $\sin\theta \sin(\omega_0 t)$ with the set amplitude to the second mixer 77.

The third variable gain amplifier 74 sets the amplitude of the one Q-signal $\cos(\omega_0 t)$ in accordance with the control signal $C_9$ output from the control circuit 71 so that the amplitude of the one Q-signal $\cos(\omega_0 t)$ is a cosine $\cos\theta$ of the phase shift amount $\theta$.

The third variable gain amplifier 74 outputs the other Q-signal $\cos\theta \cos(\omega_0 t)$ with the set amplitude to the first mixer 76.

The fourth variable gain amplifier 75 sets the amplitude of the other Q-signal $\cos(\omega_0 t)$ in accordance with the control signal $C_{10}$ output from the control circuit 71 so that the amplitude of the other Q-signal $\cos(\omega_0 t)$ is a reciprocal $1/\tan\theta$ of a tangent of the phase shift amount $\theta$.

The fourth variable gain amplifier 75 outputs the Q-signal $(1/\tan\theta)\cos(\omega_0 t)$ with the set amplitude to the second mixer 77.

The first mixer 76 multiplies the one I-signal $\tan\theta \sin(\omega_0 t)$ with the amplitude set by the first variable gain amplifier 72 by the one Q-signal $\cos\theta \cos(\omega_0 t)$ with the amplitude set by the third variable gain amplifier 74 to generate a first signal $\sin\theta \sin(2\omega_0 t)$ having a frequency $2f_0$, which is twice the frequency $f_0$ of the input signal $\sin(\omega_0 t)$.

The first mixer 76 outputs the generated first signal $\sin\theta \sin(2\omega_0 t)$ to the 90-degree combiner 78.

The second mixer 77 multiplies the other I-signal $\sin\theta \sin(\omega_0 t)$ with the amplitude set by the second variable gain amplifier 73 by the other Q-signal $(1/\tan\theta)\cos(\omega_0 t)$ with the amplitude set by the fourth variable gain amplifier 75 to generate the second signal $\cos\theta \sin(2\omega_0 t)$.

The ratio $\sin\theta/\cos\theta$ of the amplitude $\sin\theta$ of the first signal $\sin\theta \sin(2\omega_0 t)$ to the amplitude $\cos\theta$ of the second signal $\cos\theta \sin(2\omega_0 t)$ is a tangent $\tan\theta$ of the phase shift amount $\theta$.

The second mixer 77 outputs the generated second signal $\cos\theta \sin(2\omega_0 t)$ to the 90-degree combiner 78.

The 90-degree combiner 78 applies a phase difference of 90 degrees between the first signal $\sin\theta \sin(2\omega_0 t)$ generated by the first mixer 76 and the second signal $\cos\theta \sin(2\omega_0 t)$ generated by the second mixer 77, and combines the first signal having a phase difference of 90 degrees from the second signal with the second signal.

The 90-degree combiner 78 outputs the combined signal $\sin(2\omega_0 t + \theta)$ of the first signal and the second signal to the output terminal 20.

The frequency of the combined signal $\sin(2\omega_0 t + \theta)$ is $2f_0$, and the phase difference between the combined signal $\sin(2\omega_0 t + \theta)$ and the input signal $\sin(\omega_0 t)$ is $\theta$.

Next, the operation of the phase-variable frequency multiplier 1 illustrated in FIG. 13 will be explained.

The 90-degree divider 12 divides the input signal $\sin(\omega_0 t)$ with the frequency $f_0$ input via the input terminal 11 into the I-signal $\sin(\omega_0 t)$ and the Q-signal $\cos(\omega_0 t)$, in a manner similar to the first embodiment.

The 90-degree divider 12 outputs each of the I-signal $\sin(\omega_0 t)$ and the Q-signal $\cos(\omega_0 t)$ to the amplitude setting circuit 70.

Upon receiving the I-signal $\sin(\omega_0 t)$ from the 90-degree divider 12, the amplitude setting circuit 70 distributes the I-signal $\sin(\omega_0 t)$ to two paths.

The amplitude setting circuit 70 outputs one of the two distributed I-signals $\sin(\omega_0 t)$ to the first variable gain amplifier 72, and the other I-signal $\sin(\omega_0 t)$ to the second variable gain amplifier 73.

Upon receiving the Q-signal $\cos(\omega_0 t)$ from the 90-degree divider 12, the amplitude setting circuit 70 distributes the Q-signal $\cos(\omega_0 t)$ to two paths.

The amplitude setting circuit 70 outputs one of the two distributed Q-signals $\cos(\omega_0 t)$ to the third variable gain amplifier 74, and the other Q-signal $\cos(\omega_0 t)$ to the fourth variable gain amplifier 75.

The control circuit 71 outputs, to the first variable gain amplifier 72, the control signal $C_7$ for controlling the first variable gain amplifier 72 so that the amplitude of the I-signal $\sin(\omega_0 t)$ is a tangent $\tan\theta$ of the phase shift amount $\theta$.

Upon receiving the control signal $C_7$ from the control circuit 71, the first variable gain amplifier 72 sets the amplitude of the one I-signal $\sin(\omega_0 t)$ in accordance with the control signal $C_7$ so that the amplitude of the one I-signal $\sin(\omega_0 t)$ is a tangent $\tan\theta$ of the phase shift amount $\theta$.

The first variable gain amplifier 72 outputs the one I-signal $\tan\theta \sin(\omega_0 t)$ with the set amplitude to the first mixer 76.

The control circuit 71 outputs, to the second variable gain amplifier 73, the control signal $C_8$ for controlling the second variable gain amplifier 73 so that the amplitude of the I-signal $\sin(\omega_0 t)$ is a sine $\sin\theta$.

Upon receiving the control signal $C_8$ from the control circuit 71, the second variable gain amplifier 73 sets the amplitude of the other I-signal $\sin(\omega_0 t)$ in accordance with the control signal $C_8$ so that the amplitude of the other I-signal $\sin(\omega_0 t)$ is a sine $\sin\theta$ of the phase shift amount $\theta$.

The second variable gain amplifier 73 outputs the other I-signal $\sin\theta \sin(\omega_0 t)$ with the set amplitude to the second mixer 77.

The control circuit 71 outputs, to the third variable gain amplifier 74, the control signal $C_9$ for controlling the third variable gain amplifier 74 so that the amplitude of the Q-signal $\cos(\omega_0 t)$ is a cosine $\cos\theta$ of the phase shift amount $\theta$.

Upon receiving the control signal $C_9$ from the control circuit 71, the third variable gain amplifier 74 sets the amplitude of the one Q-signal $\cos(\omega_0 t)$ in accordance with the control signal $C_9$ so that the amplitude of the one Q-signal $\cos(\omega_0 t)$ is a cosine $\cos\theta$ of the phase shift amount $\theta$.

The third variable gain amplifier 74 outputs the other Q-signal $\cos\theta \cos(\omega_0 t)$ with the set amplitude to the first mixer 76.

The control circuit 71 outputs, to the fourth variable gain amplifier 75, the control signal $C_{10}$ for controlling the fourth variable gain amplifier 75 so that the amplitude of the Q-signal $\cos(\omega_0 t)$ is a reciprocal $1/\tan\theta$ of a tangent of the phase shift amount $\theta$.

Upon receiving the control signal $C_{10}$ from the control circuit 71, the fourth variable gain amplifier 75 sets the amplitude of the other Q-signal $\cos(\omega_0 t)$ in accordance with the control signal $C_{10}$ so that the amplitude of the other Q-signal $\cos(\omega_0 t)$ is a reciprocal $1/\tan\theta$ of a tangent of the phase shift amount $\theta$.

The fourth variable gain amplifier 75 outputs the other Q-signal $(1/\tan\theta)\cos(\omega_0 t)$ with the set amplitude to the second mixer 77.

Upon receiving the I-signal tan θ sin($\omega_0$t) from the first variable gain amplifier 72 and the Q-signal cos θ cos($\omega_0$t) from the third variable gain amplifier 74, the first mixer 76 multiplies the I-signal tan θ sin($\omega_0$t) by the Q-signal cos θ cos($\omega_0$t).

As a result of multiplication of the I-signal tan θ sin($\omega_0$t) by the Q-signal cos θ cos($\omega_0$t) by the first mixer 76, the first signal sin θ sin(2$\omega_0$t) with the frequency 2$f_0$, which is twice the frequency $f_0$ of the input signal sin($\omega_0$t), is generated.

The first mixer 76 outputs the generated first signal sin θ sin(2$\omega_0$t) to the 90-degree combiner 78.

Upon receiving the I-signal sin θ sin($\omega_0$t) from the second variable gain amplifier 73 and the Q-signal (1/tan θ)cos($\omega_0$t) from the fourth variable gain amplifier 75, the second mixer 77 multiplies the I-signal sin θ sin($\omega_0$t) by the Q-signal (1/tan θ)cos($\omega_0$t).

As a result of multiplication of the I-signal sin θ sin($\omega_0$t) by the Q-signal (1/tan θ)cos($\omega_0$t) by the second mixer 77, the second signal cos θ sin(2$\omega_0$t) with the frequency 2$f_0$, which is twice the frequency $f_0$ of the input signal sin($\omega_0$t) is generated.

The second mixer 77 outputs the generated second signal cos θ sin(2$\omega_0$t) to the 90-degree combiner 78.

The ratio sin θ/cos θ of the amplitude sin θ of the first signal sin θ sin(2$\omega_0$t) generated by the first mixer 76 to the amplitude cos θ of the second signal cos θ sin(2$\omega_0$t) generated by the second mixer 77 is a tangent tan θ of the phase shift amount θ.

The 90-degree combiner 78 applies a phase difference of 90 degrees between the first signal sin θ sin(2$\omega_0$t) generated by the first mixer 76 and the second signal cos θ sin(2$\omega_0$t) generated by the second mixer 77.

In a manner similar to the 90-degree combiner 19 illustrated in FIG. 2, the 90-degree combiner 78 combines the first signal with the second signal after the application of the phase difference of 90 degrees, and outputs a combined signal sin(2$\omega_0$t+θ) of the first signal and the second signal to the output terminal 20.

As described above, the phase-variable frequency multiplier 1 illustrated in FIG. 13 is capable of doubling the frequency of the input signal and shifting the phase of the input signal without degrading the phase shift resolution, in a manner similar to the phase-variable frequency multiplier 1 illustrated in FIG. 1.

Note that the embodiments of the present invention can be freely combined, any components in the embodiments can be modified, and any components in the embodiments can be omitted within the scope of the invention of the present application.

INDUSTRIAL APPLICABILITY

The present invention is suitable for a phase-variable frequency multiplier and an antenna device that apply a phase difference of 90 degrees between a first signal with a frequency that is twice the frequency of an input signal and a second signal with a frequency that is twice the frequency of the input signal, and combine the first signal with a phase difference of 90 degrees from the second signal with the second signal.

REFERENCE SIGNS LIST

1: phase-variable frequency multiplier, 1-1 to 1-N: phase-variable frequency multiplier, 2: phased array antenna, 2-1 to 2-N: antenna element, 11: input terminal, 12: 90-degree divider, 13: amplitude setting circuit, 14: control circuit, 15: first variable gain amplifier, 16: second variable gain amplifier, 17: first mixer, 18: second mixer, 19: 90-degree combiner, 20: output terminal, 31: first signal, 32: second signal after application of phase difference of 90 degrees from first signal, 33: combined signal, 40: amplitude setting circuit, 41: control circuit, 42: second variable gain amplifier, 43: second mixer, 50: amplitude setting circuit, 51: control circuit, 52: variable gain amplifier, 53: first mixer, 54: second mixer, 55: 90-degree combiner, 60: amplitude setting circuit, 61: control circuit, 62: first variable gain amplifier, 63: second variable gain amplifier, 64: first mixer, 70: amplitude setting circuit, 71: control circuit, 72: first variable gain amplifier, 73: second variable gain amplifier, 74: third variable gain amplifier, 75: fourth variable gain amplifier, 76: first mixer, 77: second mixer, 78: 90-degree combiner.

The invention claimed is:

1. A phase-variable frequency multiplier comprising:
a 90-degree divider to divide an input signal into an in-phase signal and a quadrature signal;
an amplitude setting circuit to distribute each of the in-phase signal and the quadrature signal to two paths, set amplitudes of one or more of four signals including the two distributed in-phase signals and the two distributed quadrature signals depending on a phase shift amount of the input signal, and outputting, as set signals, the four signals including one or more signals with the set amplitudes;
a first mixer to multiply a first in-phase signal of the two in-phase signals included in the set signals by a first quadrature signal of the two quadrature signals included in the set signals to generate a first signal with a doubled frequency being twice a frequency of the input signal;
a second mixer to multiply a second in-phase signal of the two in-phase signals included in the set signals by a second quadrature signal of the two quadrature signals included in the set signals to generate a second signal with an amplitude ratio with respect to the first signal, being a tangent of, or a reciprocal of a tangent of, the phase shift amount and with the doubled frequency; and
a 90-degree combiner to apply a phase difference of 90 degrees between the first signal and the second signal, and combine the first signal having the phase difference of 90 degrees from the second signal with the second signal.

2. The phase-variable frequency multiplier according to claim 1, wherein
the amplitude setting circuit includes:
a first variable gain amplifier to set an amplitude of the first in-phase signal of the two distributed in-phase signals so that the amplitude of the first in-phase signal is a cosine of the phase shift amount; and
a second variable gain amplifier to set an amplitude of the second quadrature signal of the two distributed quadrature signals so that the amplitude of the second quadrature signal is a sine of the phase shift amount,
the first mixer multiplies the first in-phase signal with the amplitude set by the first variable gain amplifier by the first quadrature signal of the two quadrature signals distributed by the amplitude setting circuit to generate the first signal, and
the second mixer multiplies the second in-phase signal of the in-phase signals distributed by the amplitude setting circuit by the second quadrature signal with the amplitude set by the second variable gain amplifier to generate the second signal.

3. The phase-variable frequency multiplier according to claim 1, wherein
the amplitude setting circuit includes:
a first variable gain amplifier to set an amplitude of the second in-phase signal of the two distributed in-phase signals so that the amplitude of the second in-phase signal is a cosine of the phase shift amount; and
a second variable gain amplifier to set an amplitude of the first quadrature signal of the two distributed quadrature signals so that the amplitude of the first quadrature signal is a sine of the phase shift amount,
the first mixer multiplies the first in-phase signal of the two in-phase signals distributed by the amplitude setting circuit by the first quadrature signal with the amplitude set by the second variable gain amplifier to generate the first signal, and
the second mixer multiplies the second in-phase signal with the amplitude set by the first variable gain amplifier by the second quadrature signal of the two quadrature signals distributed by the amplitude setting circuit to generate the first signal.

4. The phase-variable frequency multiplier according to claim 1, wherein
the amplitude setting circuit includes:
a first variable gain amplifier to set an amplitude of the first in-phase signal of the two distributed in-phase signals so that the amplitude of the first in-phase signal is a cosine of the phase shift amount; and
a second variable gain amplifier to set an amplitude of the second in-phase signal of the two distributed in-phase signals so that the amplitude of the second in-phase signal is a sine of the phase shift amount,
the first mixer multiplies the first in-phase signal with the amplitude set by the first variable gain amplifier by the first quadrature signal of the two quadrature signals distributed by the amplitude setting circuit to generate the first signal, and
the second mixer multiplies the second in-phase signal with the amplitude set by the second variable gain amplifier by the second quadrature signal of the two quadrature signals distributed by the amplitude setting circuit to generate the second signal.

5. The phase-variable frequency multiplier according to claim 1, wherein
the amplitude setting circuit includes:
a first variable gain amplifier to set an amplitude of the first quadrature signal of the two distributed quadrature signals so that the amplitude of the first quadrature signal is a cosine of the phase shift amount; and
a second variable gain amplifier to set an amplitude of the second quadrature signal of the two distributed quadrature signals so that the amplitude of the second quadrature signal is a sine of the phase shift amount,
the first mixer multiplies the first in-phase signal of the two in-phase signals distributed by the amplitude setting circuit by the first quadrature signal with the amplitude set by the first variable gain amplifier to generate the first signal, and
the second mixer multiplies the second in-phase signal of the two in-phase signals distributed by the amplitude setting circuit by the second quadrature signal with the amplitude set by the second variable gain amplifier to generate the second signal.

6. The phase-variable frequency multiplier according to claim 1, wherein
the amplitude setting circuit includes:
a variable gain amplifier to set an amplitude of the first in-phase signal of the two distributed in-phase signals so that the amplitude of the first in-phase signal is a tangent of the phase shift amount,
the first mixer multiplies the first in-phase signal with the amplitude set by the variable gain amplifier by the first quadrature signal of the two quadrature signals distributed by the amplitude setting circuit to generate the first signal, and
the second mixer multiplies the second in-phase signal of the two in-phase signals distributed by the amplitude setting circuit by the second quadrature signal of the two quadrature signals distributed by the amplitude setting circuit to generate the second signal.

7. The phase-variable frequency multiplier according to claim 1, wherein
the amplitude setting circuit includes:
a variable gain amplifier to set an amplitude of the second in-phase signal of the two distributed in-phase signals so that the amplitude of the second in-phase signal is a tangent of the phase shift amount,
the first mixer multiplies the first in-phase signal of the two in-phase signals distributed by the amplitude setting circuit by the first quadrature signal of the two quadrature signals distributed by the amplitude setting circuit to generate the first signal, and
the second mixer multiplies the first quadrature signal with the amplitude set by the variable gain amplifier by the second quadrature signal of the two quadrature signals distributed by the amplitude setting circuit to generate the second signal.

8. The phase-variable frequency multiplier according to claim 1, wherein
the amplitude setting circuit includes:
a variable gain amplifier to set an amplitude of the first quadrature signal of the two distributed quadrature signals so that the amplitude of the first quadrature signal is a tangent of the phase shift amount,
the first mixer multiplies the first in-phase signal of the two in-phase signals distributed by the amplitude setting circuit by the first quadrature signal with the amplitude set by the variable gain amplifier to generate the first signal, and
the second mixer multiplies the second in-phase signal of the two in-phase signals distributed by the amplitude setting circuit by the second quadrature signal of the two quadrature signals distributed by the amplitude setting circuit to generate the second signal.

9. The phase-variable frequency multiplier according to claim 1, wherein
the amplitude setting circuit includes:
a variable gain amplifier to set an amplitude of the second quadrature signal of the two distributed quadrature signals so that the amplitude of the second quadrature signal is a tangent of the phase shift amount,
the first mixer multiplies the first in-phase signal of the two in-phase signals distributed by the amplitude setting circuit by the first quadrature signal of the two quadrature signals distributed by the amplitude setting circuit to generate the first signal, and
the second mixer multiplies the second in-phase signal of the two in-phase signals distributed by the amplitude setting circuit by the second quadrature signal with the amplitude set by the variable gain amplifier to generate the second signal.

10. The phase-variable frequency multiplier according to claim 1, wherein the amplitude setting circuit includes:
a first variable gain amplifier to set an amplitude of the first in-phase signal of the two distributed in-phase signals so that the amplitude of the first in-phase signal is a reciprocal of a cosine of the phase shift amount; and
a second variable gain amplifier to set an amplitude of the first quadrature signal of the two distributed quadrature signals so that the amplitude of the first quadrature signal is a sine of the phase shift amount,
the first mixer multiplies the first in-phase signal with the amplitude set by the first variable gain amplifier by the first quadrature signal with the amplitude set by the second variable gain amplifier to generate the first signal, and
the second mixer multiplies the second in-phase signal of the two in-phase signals distributed by the amplitude setting circuit by the second quadrature signal of the two quadrature signals distributed by the amplitude setting circuit to generate the second signal.

11. The phase-variable frequency multiplier according to claim 1, wherein the amplitude setting circuit includes:
a first variable gain amplifier to set an amplitude of the second in-phase signal of the two distributed in-phase signals so that the amplitude of the second in-phase signal is a reciprocal of a cosine of the phase shift amount; and
a second variable gain amplifier to set an amplitude of the second quadrature signal of the two distributed quadrature signals so that the amplitude of the second quadrature signal is a sine of the phase shift amount,
the first mixer multiplies the first in-phase signal of the two in-phase signals distributed by the amplitude setting circuit by the first quadrature signal of the two quadrature signals distributed by the amplitude setting circuit to generate the first signal, and
the second mixer multiplies the second in-phase signal with the amplitude set by the first variable gain amplifier by the second quadrature signal with the amplitude set by the second variable gain amplifier to generate the second signal.

12. The phase-variable frequency multiplier according to claim 1, wherein the amplitude setting circuit includes:
a first variable gain amplifier to set an amplitude of the first in-phase signal of the two distributed in-phase signals so that the amplitude of the first in-phase signal is a tangent of the phase shift amount;
a second variable gain amplifier to set an amplitude of the second in-phase signal of the two distributed in-phase signals so that the amplitude of the second in-phase signal is a sine of the phase shift amount;
a third variable gain amplifier to set an amplitude of the first quadrature signal of the two distributed quadrature signals so that the amplitude of the first quadrature signal is a cosine of the phase shift amount; and
a fourth variable gain amplifier to set an amplitude of the second quadrature signal of the two distributed quadrature signals so that the amplitude of the second quadrature signal is a reciprocal of a tangent of the phase shift amount,
the first mixer multiplies the first in-phase signal with the amplitude set by the first variable gain amplifier by the first quadrature signal with the amplitude set by the third variable gain amplifier to generate the first signal, and
the second mixer multiplies the second in-phase signal with the amplitude set by the second variable gain amplifier by the second quadrature signal with the amplitude set by the fourth variable gain amplifier to generate the second signal.

13. An antenna device comprising:
a plurality of phase-variable frequency multipliers to shift a phase of an input signal; and
a phased array antenna including a plurality of antenna elements to transmit respective input signals with phases shifted by the respective phase-variable frequency multipliers, wherein,
the phase-variable frequency multipliers each includes:
a 90-degree divider to divide the input signal into an in-phase signal and a quadrature signal;
an amplitude setting circuit to distribute each of the in-phase signal and the quadrature signal to two paths, setting amplitudes of one or more of four signals including the two distributed in-phase signals and the two distributed quadrature signals depending on a phase shift amount of the input signal, and outputting, as set signals, the four signals including one or more signals with the set amplitudes;
a first mixer to multiply a first in-phase signal of the two in-phase signals included in the set signals by a first quadrature signal of the two quadrature signals included in the set signals to generate a first signal with a doubled frequency being twice a frequency of the input signal;
a second mixer to multiply a second in-phase signal of the two in-phase signals included in the set signals by a second quadrature signal of the two quadrature signals included in the set signals to generate a second signal with an amplitude ratio with respect to the first signal, being a tangent of, or a reciprocal of a tangent of, the phase shift amount and with the doubled frequency; and
a 90-degree combiner to apply a phase difference of 90 degrees between the first signal and the second signal, and combining the first signal having the phase difference of 90 degrees from the second signal with the second signal.

* * * * *